(12) United States Patent
Meyer et al.

(10) Patent No.: US 12,716,972 B2
(45) **Date of Patent: *Aug. 25, 2026**

(54) SYSTEMS AND METHODS FOR MAGNETIC RESONANCE BASED SKULL THERMOMETRY

(71) Applicant: University of Virginia Patent Foundation, Charlottesville, VA (US)

(72) Inventors: Craig H. Meyer, Charlottesville, VA (US); John P. Mugler, III, Charlottesville, VA (US); Grady Wilson Miller, IV, Charlottesville, VA (US); Sheng Chen, Charlottesville, VA (US); Helen L. Sporkin, Charlottesville, VA (US); Steven P. Allen, Charlottesville, VA (US); Zhixing Wang, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/641,158

(22) Filed: Apr. 19, 2024

(65) Prior Publication Data

US 2024/0353514 A1 Oct. 24, 2024

Related U.S. Application Data

(60) Provisional application No. 63/467,247, filed on May 17, 2023, provisional application No. 63/460,680, filed on Apr. 20, 2023.

(51) Int. Cl.

*A61B 5/01* (2006.01)
*A61B 5/00* (2006.01)
(Continued)

(52) U.S. Cl.

CPC ..... *G01R 33/4814* (2013.01); *G01R 33/4804* (2013.01); *G01R 33/4816* (2013.01); *G01R 33/50* (2013.01)

(58) Field of Classification Search

CPC ........... G01R 33/4814; G01R 33/4804; G01R 33/4816; G01R 33/50

See application file for complete search history.

(56) References Cited

U.S. PATENT DOCUMENTS

| | | | |
|---|---|---|---|
| 5,245,282 | A | 9/1993 | Mugler, III et al. |
| 6,775,568 | B2 | 8/2004 | Mugler, III et al. |

(Continued)

FOREIGN PATENT DOCUMENTS

| | | | |
|---|---|---|---|
| WO | 2002050574 | A1 | 6/2002 |
| WO | 2002084305 | A1 | 10/2002 |

(Continued)

OTHER PUBLICATIONS

Odéen, Henrik, and Dennis L. Parker. “Improved MR thermometry for laser interstitial thermotherapy.” Lasers in surgery and medicine 51.3 (2019): 286-300.

(Continued)

*Primary Examiner* — Baisakhi Roy
(74) *Attorney, Agent, or Firm* — Meunier Carlin & Curfman LLC

(57) ABSTRACT

Described herein are systems, methods, and computer-readable medium for magnetic resonance (MR) based thermometry. A method for magnetic resonance based thermometry includes: acquiring, by a variable flip-angle T1 mapping sequence, MR data in an area of interest of a subject that is heated by the application of focused ultrasound (FUS) to the brain of the subject, where the MR data includes T1 values over time, and where the acquisition of the MR data includes applying an accelerated three-dimensional ultra-short spiral (Continued)

acquisition sequence with a nonselective excitation pulse; tracking changes in proton resonance frequency and determining, based at least in part on a mathematical relationship established by T1 mapping thermometry, a temperature change in the area of interest over time, and where the temperature change is caused at least in part by a change in the applied FUS.

14 Claims, 29 Drawing Sheets

(51) Int. Cl.
*A61B 18/18* (2006.01)
*A61B 18/20* (2006.01)
*G01R 33/48* (2006.01)
*G01R 33/50* (2006.01)
*G01R 33/56* (2006.01)
*G01R 33/58* (2006.01)

(56) References Cited

U.S. PATENT DOCUMENTS 7,034,533 B2 4/2006 Mugler, III et al.
7,164,268 B2 1/2007 Mugler, III et al.
7,174,200 B2 2/2007 Salerno et al.
7,583,082 B1 9/2009 Hu et al.
7,642,777 B1 1/2010 Meyer et al.
7,705,597 B2 4/2010 Horger et al.
7,805,176 B2 9/2010 Ruppert et al.
7,888,935 B1 2/2011 Tan et al.
8,026,720 B1 9/2011 Chen et al.
8,094,907 B1 1/2012 Meyer et al.
8,238,634 B1 8/2012 Meyer et al.
8,306,289 B1 11/2012 Meyer et al.
8,440,167 B2 5/2013 Beller et al.
RE44,644 E 12/2013 Mugler, III et al.
RE45,725 E 10/2015 Mugler, III et al.
9,183,626 B2 11/2015 Zhao et al.
9,322,896 B2 4/2016 Fielden et al.
9,360,545 B2 6/2016 Mugler, III et al.
9,589,345 B2 3/2017 Zhao et al.
9,651,645 B2 5/2017 Fielden et al.
9,811,924 B2 11/2017 Johnson et al.
9,874,623 B2 1/2018 Fielden et al.
9,891,300 B2 2/2018 Mugler et al.
9,910,118 B2 3/2018 Feng et al.
9,953,439 B2 4/2018 Salerno et al.
9,989,611 B2 6/2018 Zhao et al.
10,054,656 B2 8/2018 Horger et al.
RE47,178 E 12/2018 Mugler, III et al.
10,143,384 B2 12/2018 Chen et al.
10,314,511 B2 6/2019 Meyer et al.
10,557,908 B2 2/2020 Meyer et al.
10,561,337 B2 2/2020 Zhao et al.
10,718,837 B2 7/2020 Mugler, III et al.
10,722,137 B2 7/2020 Fielden et al.
RE48,347 E 12/2020 Mugler, III et al.
11,024,025 B2 6/2021 Meyer et al.
11,085,980 B2* 8/2021 Fielden .................. G01R 33/50
11,204,409 B2 12/2021 Wang et al.
11,294,015 B2 4/2022 Abdishektaei et al.
11,320,506 B2 5/2022 Sun et al.
11,644,520 B2* 5/2023 Gilbo ................. G01R 33/4814 600/411
12,085,631 B2* 9/2024 Trzasko ............. G01R 33/5616
2007/0197903 A1 8/2007 Mugler, III et al.
2010/0280358 A1 11/2010 Mata et al.
2015/0282719 A1 10/2015 Fielden et al.
2015/0287222 A1 10/2015 Zhao et al.
2017/0035301 A1* 2/2017 Lechner-Greite .... A61B 5/7285
2017/0202478 A1 7/2017 Handsfield et al.
2017/0328972 A1* 11/2017 Fielden .................. G01R 33/50
2018/0120396 A1* 5/2018 Weiss ..................... A61B 18/02
2020/0333417 A1* 10/2020 Svedin ................... G01R 33/50
2021/0208225 A1* 7/2021 Gilbo ..................... G01R 33/50
2021/0267455 A1 9/2021 Ghadimi et al.
2021/0287367 A1 9/2021 Meyer et al.
2022/0125314 A1 4/2022 Meyer et al.
2022/0188602 A1 6/2022 Meyer et al.
2022/0338750 A1 10/2022 Allen et al.
2022/0349970 A1* 11/2022 Wang ................ G01R 33/5613
2022/0357416 A1 11/2022 Mugler, III et al.
2022/0373627 A1 11/2022 Wang et al.
2022/0373630 A1 11/2022 Dou et al.
2023/0342886 A1 10/2023 Meyer et al.

FOREIGN PATENT DOCUMENTS

WO 2003098390 A1 11/2003
WO 2005086931 A1 9/2005
WO 2005086932 A1 9/2005
WO 2010062557 A1 6/2010
WO 2012145547 A1 10/2012
WO 2013023214 A1 2/2013
WO 2016004423 A1 1/2016
WO 2020163539 A1 8/2020
WO 2020219915 A1 10/2020
WO 2021055889 A1 3/2021

OTHER PUBLICATIONS

Chen, Sheng, et al. "Combining Proton Resonance Frequency Shift and T1-mapping Thermometry with a 3D Spiral Ultra-Short Echo Time Sequence." Abstract #2151. May 7-12, 2022.

Gilbo Y, Sporkin H, Fielden S, Mugler JP, Miller W, Allen S, Meyer CH. Detecting T1-based signal reduction in focused ultrasound heating of bone using a 3D spiral ultrashort echo time sequence. Proceedings 27th Annual Meeting ISMRM, Montréal. 2019:3812.

Pinton G, Aubry JF, Bossy E, Muller M, Pernot M, Tanter M. Attenuation, scattering, and absorption of ultrasound in the skull bone. Med Phys. Jan. 2012;39(1):299-307.

Schwartz ML, Yeung R, Huang Y, Lipsman N, Krishna V, Jain JD, Chapman MG, Lozano AM, Hynynen K. Skull bone marrow injury caused by MR-guided focused ultrasound for cerebral functional procedures. J Neurosurg. May 4, 2018;130(3):758-762.

Sporkin H, Gilbo Y, Fielden S, Mugler JP, Miller W, Pfeuffer J, Kiefer B, Meyer CH. Detecting T1-based signal reduction in focused ultrasound heating of bone at 1.5T using a 3D spiral ultra-short echo time sequence. Proceedings 26th Annual Meeting ISMRM, Paris. 2018:1495.

Han M, Rieke V, Scott SJ, Ozhinsky E, Salgaonkar VA, Jones PD, Larson PE, Diederich CJ, Krug R. Quantifying temperature-dependent T1 changes in cortical bone using ultrashort echo-time MRI. Magn Reson Med. Dec. 2015;74(6):1548-55.

Wang P., Evaluation of MR Thermometry with Proton Resonance Frequency Method at 7T; Quant. Imaging Med. Surgery 2017; 7(2):259-266. doi: 10.21037/qims.2017.03.05.

Botnar, R. M. et al, Temperature Quantification Using Proton Frequency Shift Technique : In Vitro and In Vivo Validation in an Open 0.5 Tesla Interventional MR Scanner During RF Ablation; Journal of Magnetic Resonance Imaging 13:437-444 (2001).

Lee Y, Callaghan MF, Nagy Z. Analysis of the Precision of Variable Flip Angle T1 Mapping with Emphasis on the Noise Propagated from RF Transmit Field Maps. Front Neurosci. Mar. 9, 2017;11:106.

Cunningham CH, Pauly JM, Nayak KS. Saturated double-angle method for rapid B1+ mapping. Magn Reson Med. Jun. 2006;55(6):1326-33.

Yarnykh VL. Actual flip-angle imaging in the pulsed steady state: a method for rapid three-dimensional mapping of the transmitted radiofrequency field. Magn Reson Med. Jan. 2007;57(1):192-200.

Morrell GR. A phase-sensitive method of flip angle mapping. Magn Reson Med. Oct. 2008;60(4):889-94.

Morrell GR, Schabel MC. An analysis of the accuracy of magnetic resonance flip angle measurement methods. Phys Med Biol. Oct. 21, 2010;55(20):6157-74.

(56) References Cited

OTHER PUBLICATIONS

Pohmann R, Scheffler K. A theoretical and experimental comparison of different techniques for B, mapping at very high fields. NMR Biomed. Mar. 2013;26(3):265-75.

Fielden S, Mugler J, Miller W, Stemmer A, Pfeuffer J, Kiefer B, Meyer C. A variable-TE stack-of-spiral sequence for 3D UTE imaging. Proc. Intl. Soc. Mag. Reson. Med. 2016;24:1062.

Ketsiri T, Uppuganti S, Harkins KD, Gochberg DF, Nyman JS, Does MD. T1 Relaxation of Bound and Pore Water in Cortical Bone. NMR Biomed. May 2023; 36(5) : e4878.

Otazo R, Candès E, Sodickson DK. Low-rank plus sparse matrix decomposition for accelerated dynamic MRI with separation of background and dynamic components. Magn Reson Med. Mar. 2015;73(3):1125-36.

Uecker M, Lai P, Murphy MJ, Virtue P, Elad M, Pauly JM, Vasanawala SS, Lustig M. ESPIRiT—an eigenvalue approach to auto-calibrating parallel MRI: where SENSE meets GRAPPA. Magn Reson Med. Mar. 2014; 71(3):990-1001.

* cited by examiner

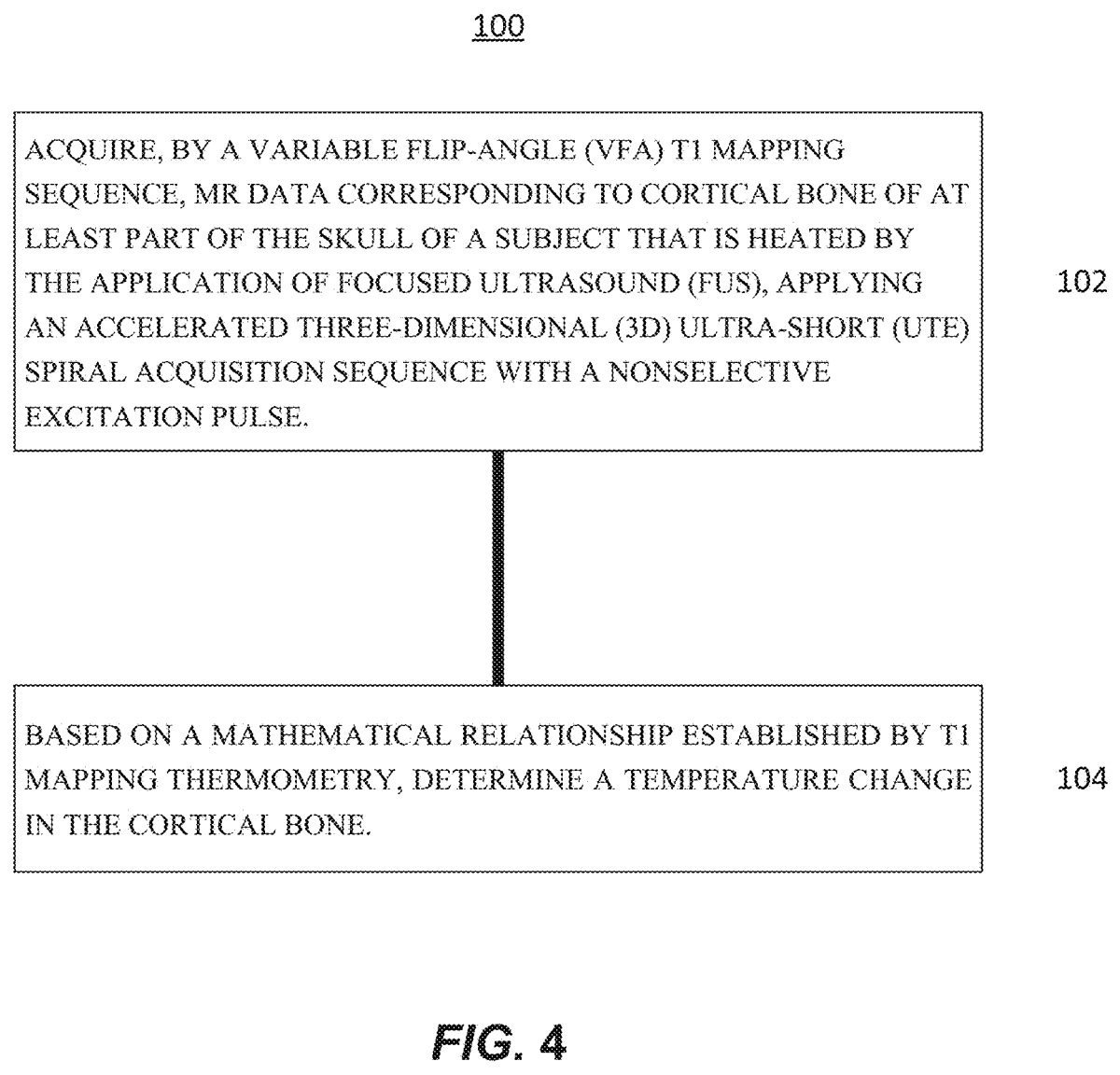

100

ACQUIRE, BY A VARIABLE FLIP-ANGLE (VFA) T1 MAPPING SEQUENCE, MR DATA CORRESPONDING TO CORTICAL BONE OF AT LEAST PART OF THE SKULL OF A SUBJECT THAT IS HEATED BY THE APPLICATION OF FOCUSED ULTRASOUND (FUS), APPLYING AN ACCELERATED THREE-DIMENSIONAL (3D) ULTRA-SHORT (UTE) SPIRAL ACQUISITION SEQUENCE WITH A NONSELECTIVE EXCITATION PULSE. 102

BASED ON A MATHEMATICAL RELATIONSHIP ESTABLISHED BY T1 MAPPING THERMOMETRY, DETERMINE A TEMPERATURE CHANGE IN THE CORTICAL BONE. 104

FIG. 4

| Echo Time | Temporal Resolution | Spatial Resolution | FOV (3D) |
|---|---|---|---|
| ≤ 100$us$ | ≤ 90s | ≤ 5 x 5 x 5 mm | ≥ 280 x 280 x 200 mm |

SYSTEMS AND METHODS FOR MAGNETIC RESONANCE BASED SKULL THERMOMETRY

CROSS-REFERENCE TO RELATED APPLICATIONS

This application claims priority to and the benefit of U.S. provisional patent application No. 63/460,680, filed on Apr. 20, 2023, and titled Method and System for Combining Proton Resonance Frequency Shift and T1-mapping Thermometry with a 3D Spiral Ultra-Short Echo Time Sequence," the disclosure of which is hereby incorporated by reference herein in its entirety.

This application also claims priority to and the benefit of U.S. provisional patent application No. 63/467,247, filed on May 17, 2023, and titled System and Method for Low-Rank Plus Sparse Accelerated Proton Resonance Frequency Shift and T1-Mapping with a Dual-Echo 3D Spiral Ultra-Short Echo Time Sequence" the disclosure of which is hereby incorporated by reference herein in its entirety.

STATEMENT OF GOVERNMENT RIGHTS

This invention was made with government support under grant number EB028773 awarded by the National Institutes of Health. The government has certain rights in the invention.

BACKGROUND

Magnetic resonance guided focused ultrasound (MRgFUS) can enable brain surgery with focused ultrasound (FUS) waves mechanically perturbing or heating brain tissue. The procedure can be performed by placing a patient's head into a FUS helmet composed of a number of transducers (e.g. 1024 transducers). By computing the timing at which transducers need to turn on (phase delays) to focus the waves at a specific spot, a surgeon can destroy the targeted tissue to millimeter precision at ablative temperatures (55-60° C.) with no damage to surrounding tissue and thereby treat different disorders. An MRI is used to image the target and to determine the coordinates for the FUS system as well as to monitor the effect of the treatment through changes in T1, T2, and diffusion of the target. For example, MRgFUS has been successfully applied to treat patients with essential tremor (ET). Patients with ET have a tremor typically affecting their hands and quality of life making functional activities such as drinking a glass of water, dressing, or writing very difficult. Ablation of the thalamus in the brain helps to suppress the tremor observed during and immediately after the procedure. MRgFUS in the brain can also treat the symptoms of Parkinson's disease, neuropathic pain, and brain tumors. Though MRgFUS is a rapidly growing technology in interventional radiology and functional neurosurgery, there remain many technical challenges to be solved so that MRgFUS can be a widespread treatment option for neuropathology.

Examples of medical applications include FDA approved treatment for Parkinson's disease and essential tremor and many other disorders in the research stage such as neuropathic pain, depression, and obsessive-compulsive disorder. One challenge to treatment efficacy is posed by the skull. Its high absorption of ultrasound waves creates difficulties, one of which is skull heating. Damage from skull heating has been observed in several patients. Though damage has not been shown to be harmful, it may be linked to problems such as headaches during treatment. Temperature monitoring of the skull would increase treatment safety, enable further development of MRgFUS therapy to non-central brain targets, and potentially speed up treatment by decreasing waiting time between sonications for patients. MRI based thermometry is well suited for this task as monitoring of the brain temperature is already done by MRI.

Bone can attenuate ultrasound energy 20 times more efficiently than soft tissue. Heating of the skull during FUS therapy can be a major concern and limit the amount of acoustic energy that can be safely transmitted into the brain and constrain which parts of the brain can be targeted. Targets away from the center of the brain lead to more skull heating. Despite current clinical precautions such as cooling the scalp actively with circulating water, there is still potential for injury. A recent study has shown that MRgFUS led to unintended skull lesions in 16 out of 40 MRgFUS procedures. Real-time skull thermometry can validate proposed skull heating models and prevent unintended injury to patients. It can also make treatment faster as surgeons can wait 6-15 minutes for the skull to cool in between sonications during the long (e.g. three hour) treatment in which the patient is awake in the MRI and their skull is pinned to a frame. If the skull is shown to have returned to thermal baseline, the treatment can continue more quickly. Lastly, monitoring of skull heating would enable the development of MRgFUS for less central targets, such as for treatment of depression.

It is with respect to these and other considerations that the various aspects of the present disclosure as described below are presented.

SUMMARY

Other aspects and features according to the example embodiments of the disclosed technology will become apparent to those of ordinary skill in the art, upon reviewing the following detailed description in conjunction with the accompanying figures.

In one embodiment, a method for magnetic resonance (MR) based thermometry includes acquiring, by a variable flip-angle (VFA) T1 mapping sequence, MR data in an area of interest of a subject corresponding to cortical bone of at least part of the skull that is heated by the application of focused ultrasound (FUS) to a selective portion of the brain of the subject, wherein the MR data comprises a plurality of T1 values over time that include a first point in time and a second, later point time, and wherein the acquisition of the MR data comprises applying an accelerated three-dimensional (3D) ultra-short (UTE) spiral acquisition sequence with a nonselective excitation pulse; calculating a corresponding temperature change by tracking changes in a proton resonance frequency (PRF) during the application of the focused ultrasound; determining, based at least in part on a mathematical relationship established by T1 mapping thermometry produced according to the T1 mapping sequence and the changes in the proton resonance frequency (PRF), a temperature change in the cortical bone that occurs between the first point in time and the second point in time, and wherein the temperature change is caused at least in part by a change in the applied FUS.

In another embodiment, a method for magnetic resonance (MR) based thermometry includes acquiring, by a variable flip-angle (VFA) T1 mapping sequence, MR data in an area of interest of a subject corresponding to cortical bone of at least part of the skull that is heated by the application of focused ultrasound (FUS) to a selective portion of the brain of the subject, wherein the MR data comprises a plurality of T1 values over time that include a first point in time and a second, later point time, and wherein the acquisition of the MR data comprises applying an accelerated three-dimensional (3D) ultra-short (UTE) spiral acquisition sequence with a low rank plus sparse sampling method; calculating a corresponding temperature change by tracking changes in a proton resonance frequency (PRF) during the application of the focused ultrasound; determining, based at least in part on a mathematical relationship established by T1 mapping thermometry produced according to the T1 mapping sequence and the changes in the proton resonance frequency (PRF), a temperature change in the cortical bone that occurs between the first point in time and the second point in time, and wherein the temperature change is caused at least in part by a change in the applied FUS.

In another embodiment, a method for magnetic resonance (MR) based thermometry includes calculating a corresponding temperature change by tracking changes in a proton resonance frequency (PRF) during the application of the focused ultrasound; tabulating a phase sensitive B1 map of soft tissue subject to the focused ultrasound; extrapolating the phase sensitive B1 map of soft tissue to form a phase sensitive B1 map of bone tissue proximate the soft tissue; acquiring, by a variable flip-angle (VFA) T1 mapping sequence, MR data in an area of interest of a subject corresponding to cortical bone of at least part of the skull that is heated by the application of focused ultrasound (FUS) to a selective portion of the brain of the subject, using the B1 map of the bone tissue to correct flip angles in the T1 mapping sequence; wherein the MR data comprises a plurality of T1 values over time that include a first point in time and a second, later point time, and wherein the acquisition of the MR data comprises applying an accelerated three-dimensional (3D) ultra-short (UTE) spiral acquisition sequence with a low rank plus sparse sampling method; and determining, based at least in part on a mathematical relationship established by T1 mapping thermometry produced according to the T1 mapping sequence and the changes in the proton resonance frequency (PRF), a temperature change in the cortical bone that occurs between the first point in time and the second point in time, and wherein the temperature change is caused at least in part by a change in the applied FUS.

BRIEF DESCRIPTION OF THE DRAWINGS

Reference will now be made to the accompanying drawings, which are not necessarily drawn to scale.

FIG. 4 is a flow diagram showing operations of a method for performing accelerated T1 thermometry in accordance with an embodiment of the present disclosure.

FIG. 5 is a table illustrating non-limiting examples of clinical parameters that can be achieved using embodiments of the present disclosure.

FIGS. 7A-7B are illustrations of UTE VIBE data, wherein FIG. 7A is an illustration of simulated data showing the relationship between the duration of the UTE VIBE vs kz number wherein. zRes=5 mm, zFOV=30 cm; and FIG. 7B is an illustration of Echo Time vs. kz. zRes=5 mm, zFOV=30 cm.

FIGS. 8A-8B illustrate simulated MR data showing how kz dependent T2 decay leads to blur in Z with zRes=5 mm, and zFOV=30 cm, wherein FIG. 8A illustrates the relationship between T2 decay and kz; and FIG. 8B illustrates the relationship between the signal and Z.

FIGS. 13A-13C illustrate the accuracy of T1 thermometry, wherein FIG. 13A illustrates the accuracy of the T1-Mapping Method using IR, FIG. 13B illustrates the bone thermometry method using VFA, and FIG. 13C illustrates a comparison of the accuracy of T1 derived from VFA to T1 from IR and compares the methods to the expected result.

FIG. 23 illustrates T1 maps of cortical bone only that were generated from fully-sampled data (top row) and under-sampled data by L+S (bottom row). The gel region was masked out, and the T1 maps were zoomed in to show the bone region.

DETAILED DESCRIPTION

Figure 1:
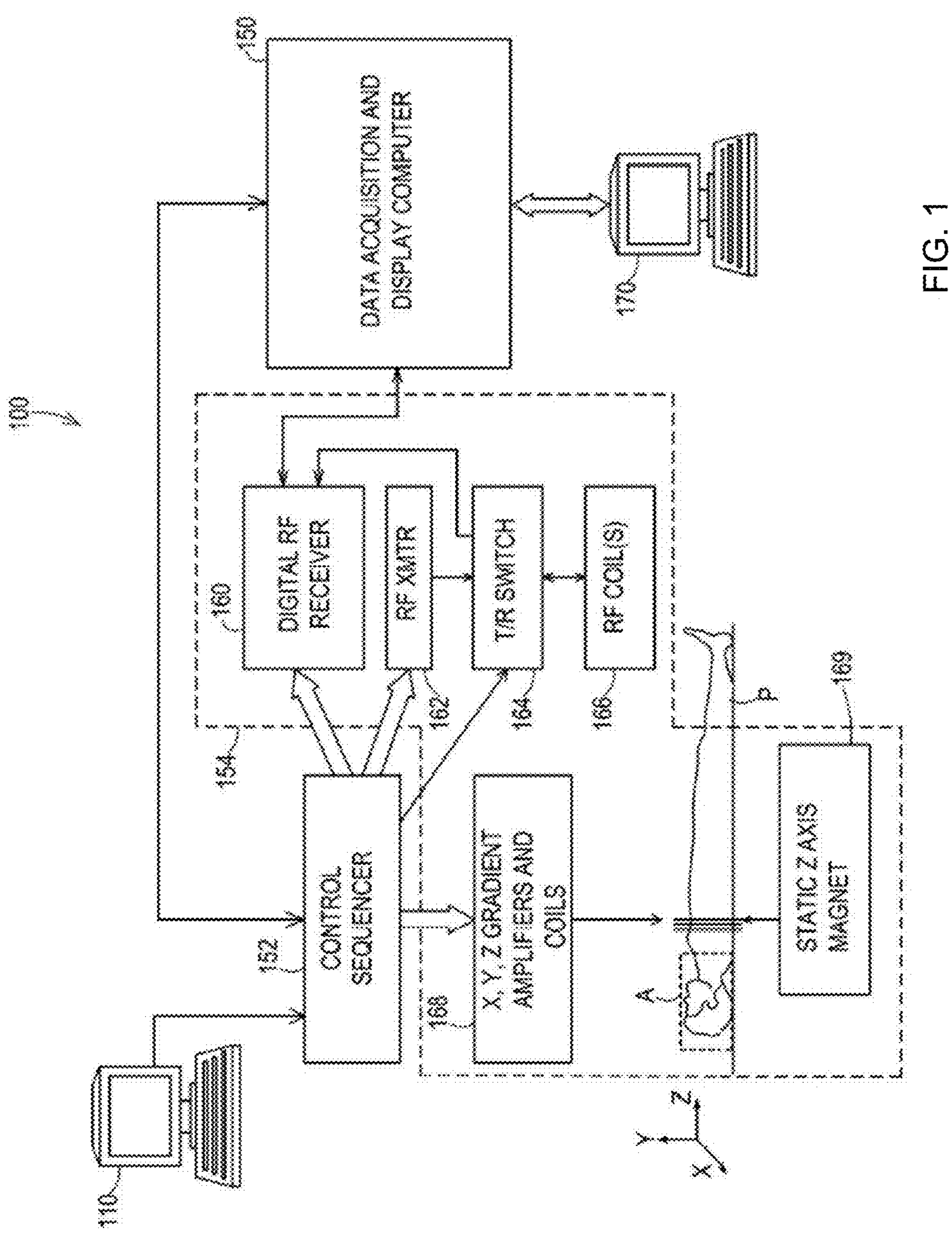
FIG. 1 is a system diagram illustrating an imaging system capable of implementing aspects of the present disclosure in accordance with one or more embodiments.

In some aspects, the disclosed technology relates to systems, methods, and computer-readable medium for magnetic resonance based skull thermometry. Although example embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest."

A detailed description of aspects of the disclosed technology, in accordance with various example embodiments, will now be provided with reference to the accompanying drawings. The drawings form a part hereof and show, by way of illustration, specific embodiments and examples. In referring to the drawings, like numerals represent like elements throughout the several figures.

Embodiments of the present disclosure include MRI-based thermometry techniques. In some embodiments of the present disclosure, the MRI-based thermometry technique is adapted to measure heating in the skull of a human patient during a focused ultrasound (FUS) treatment.

FIG. 1 is a system diagram illustrating an imaging system capable of implementing aspects of the present disclosure in accordance with one or more example embodiments. FIG. 1 illustrates an example of a magnetic resonance imaging (MRI) system 100, including a data acquisition and display computer 150 coupled to an operator console 110, an MRI real-time control sequencer 152, and an MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a subject P to be imaged, for example to implement magnetic resonance imaging sequences in accordance with various embodiments of the present disclosure. Reconstructed images, such as contrast-enhanced image(s) of an area of interest A of the subject P may be shown on display 170.

The area of interest A shown in the example embodiment of FIG. 1 corresponds to a head region of subject P, but it should be appreciated that the area of interest for purposes of implementing various aspects of the disclosure presented herein is not limited to the head area. It should be recognized and appreciated that the area of interest in various embodiments may encompass various areas of subject P associated with various physiological characteristics, such as, but not limited to the head and brain region, chest region, heart region, abdomen, upper or lower extremities, or other organs or tissues. Various aspects of the present disclosure are described herein as being implemented on portions of the skeletal system of human subjects, for example cortical bone tissue.

It should be appreciated that any number and type of computer-based medical imaging systems or components, including various types of commercially available medical imaging systems and components, may be used to practice certain aspects of the present disclosure. Systems as described herein with respect to imaging are not intended to be specifically limited to the particular system shown in FIG. 1. Likewise, systems as described herein with respect to the application of localized energy for heating certain areas for thermal treatment are not intended to be specifically limited to the particular systems shown or described below.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

Figure 2:
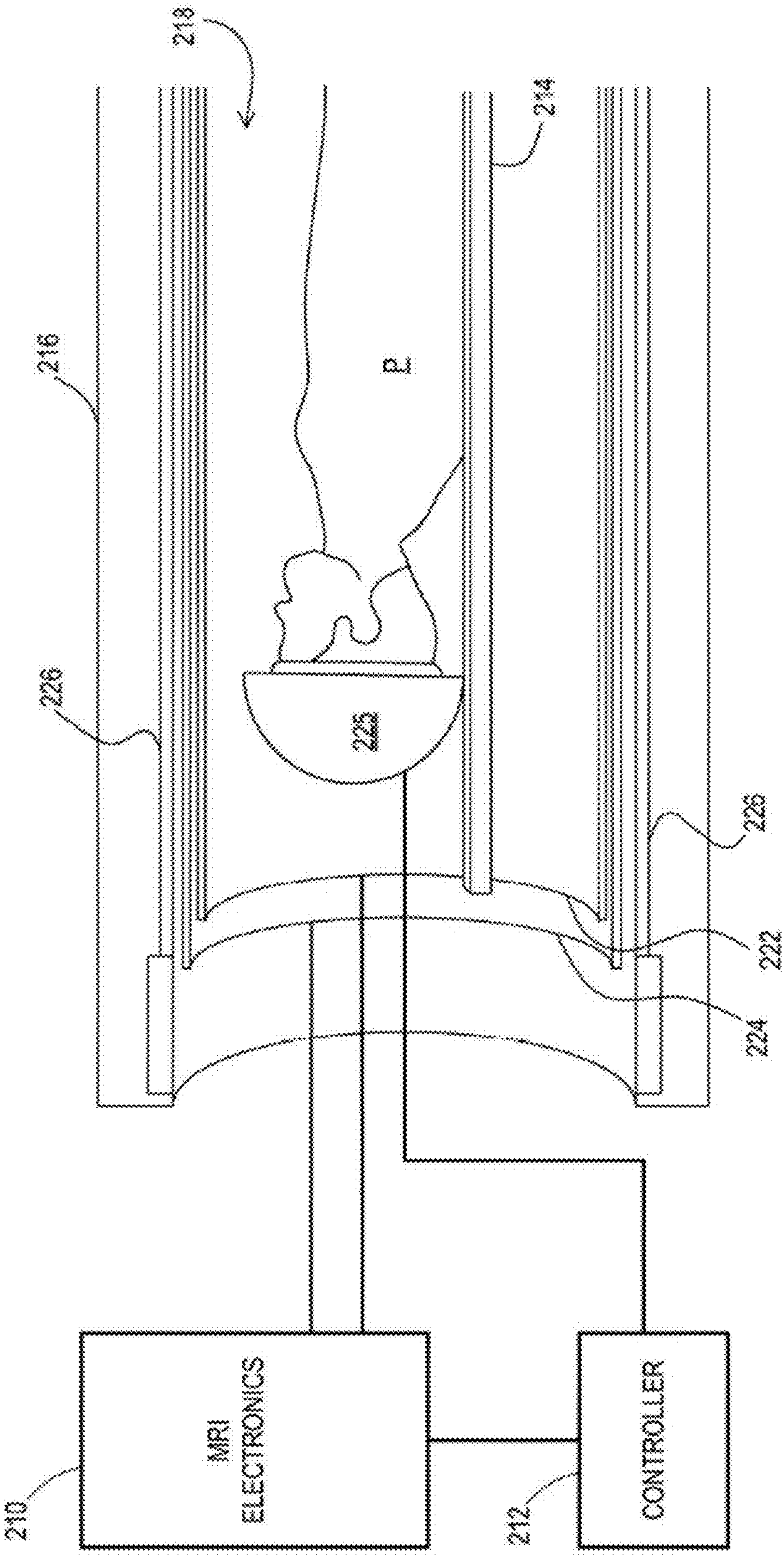
FIG. 2 is a diagram showing an example embodiment of a system with thermal therapy used with MRI, which is capable of implementing aspects of the present disclosure in accordance with one or more embodiments.

FIG. 2 is a diagram showing an embodiment of a system with focused ultrasound (FUS) used with MRI, each of which is capable of implementing aspects of the present disclosure in accordance with one or more embodiments. The MRI system may comprise one or more components of the system 100 shown in FIG. 1. As shown, RF coils 222, gradient coils 224, static Z axis magnet 226, and magnetic housing 216 surround the patient P when the patient is positioned on the table 214 inside of the MRI bore 218. A controller 212 communicates with MRI system electronics 210 as well as the FUS device (225). The MRI system electronics 210 can include one or more components of the MRI subsystem 154 shown in FIG. 23. A user computer (not shown) may communicate with the controller 212 for control of the MRI system and FUS device functions.

In FIG. 2, a type of FUS device 225 surrounds the patient's head, as may be used for thermal therapy applied to tissues of or near the brain. The device 225 may have multiple ultrasound transducers for applying focused energy to particular target areas of interest of the head of the patient.

The device 225 can be configured to apply localized energy to heat a targeted region within the area of interest A which includes tissues of or near the brain. As a result, heating may occur in bone tissues, such as that of the skull. The MRI components of the system (including MRI electronics 210) are configured to work within a larger MRI system to acquire magnetic resonance data and for reconstructing images of all or regions of the area of interest as well as temperature-related data. The temperature data may include a temperature at a targeted region and/or a temperature at a reference region. The temperature data may be used to monitor the effectiveness and safety of the thermal therapy treatment and adjust treatment settings accordingly.

The targeted region may include bone tissue, which as described above, has a short T2/T2*. Control of the application of the focused energy via the controller 212 may be managed by an operator using an operator console (e.g., user computer). The controller 212 (which, as shown is also coupled to MRI electronics 210) may also be configured to manage functions for the application and/or receiving of MR signals. For example, the controller 212 may be coupled to a control sequencer such as the control sequencer 152 shown in FIG. 1.

Although the FUS device 225 shown in the embodiment of FIG. 2 utilize ultrasound transducer(s) as the source for delivering localized energy to an area of interest, it should be appreciated that other types of devices may alternatively be used without departing from the patentable scope of the present disclosure. Other possible types of thermal treatment/application devices that may be utilized include laser and/or RF ablation devices, or other devices adapted to heat a target tissue.

Figure 3:
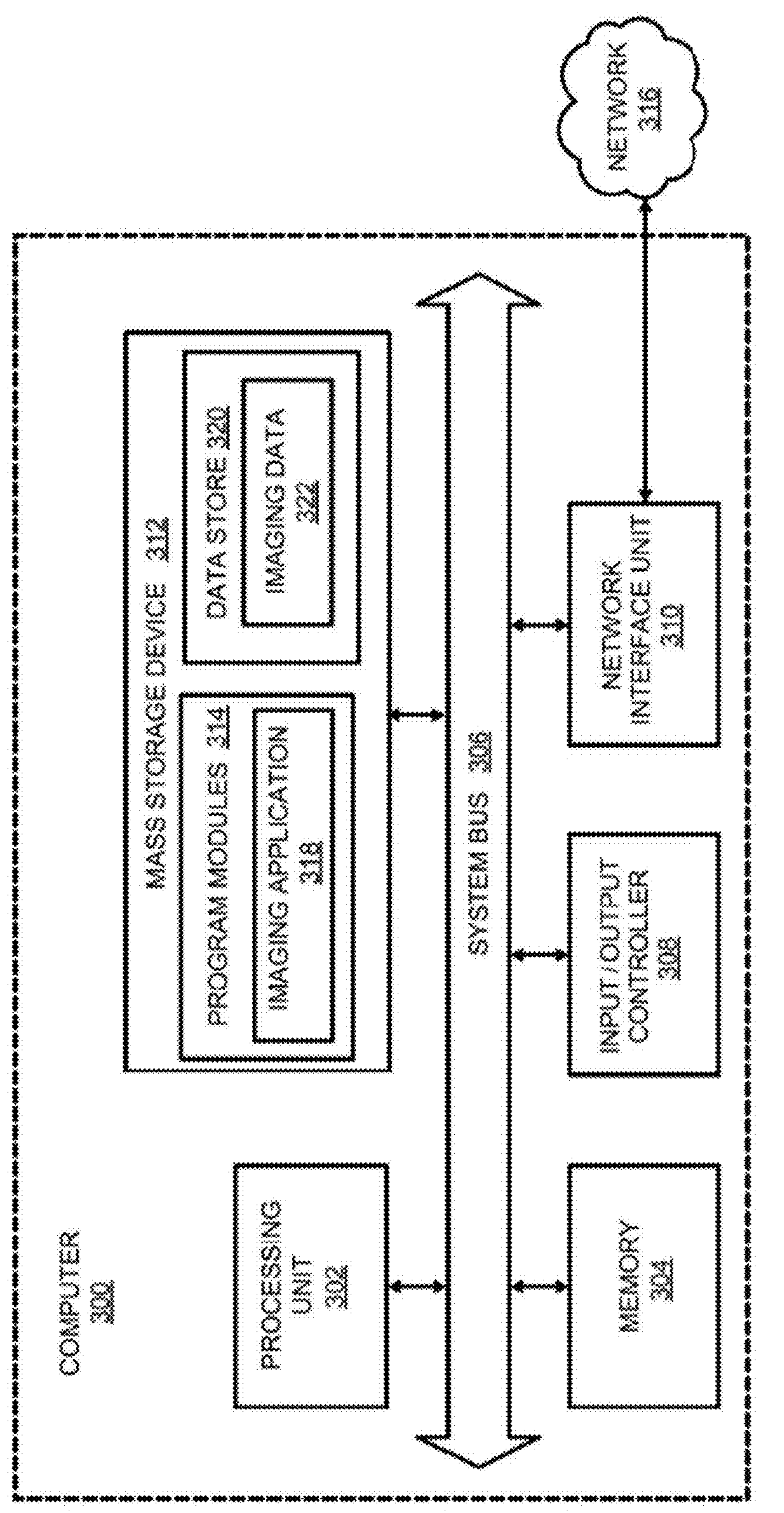
FIG. 3 is a computer architecture diagram showing a computing system capable of implementing aspects of the present disclosure in accordance with one or more embodiments.
Figure 6:
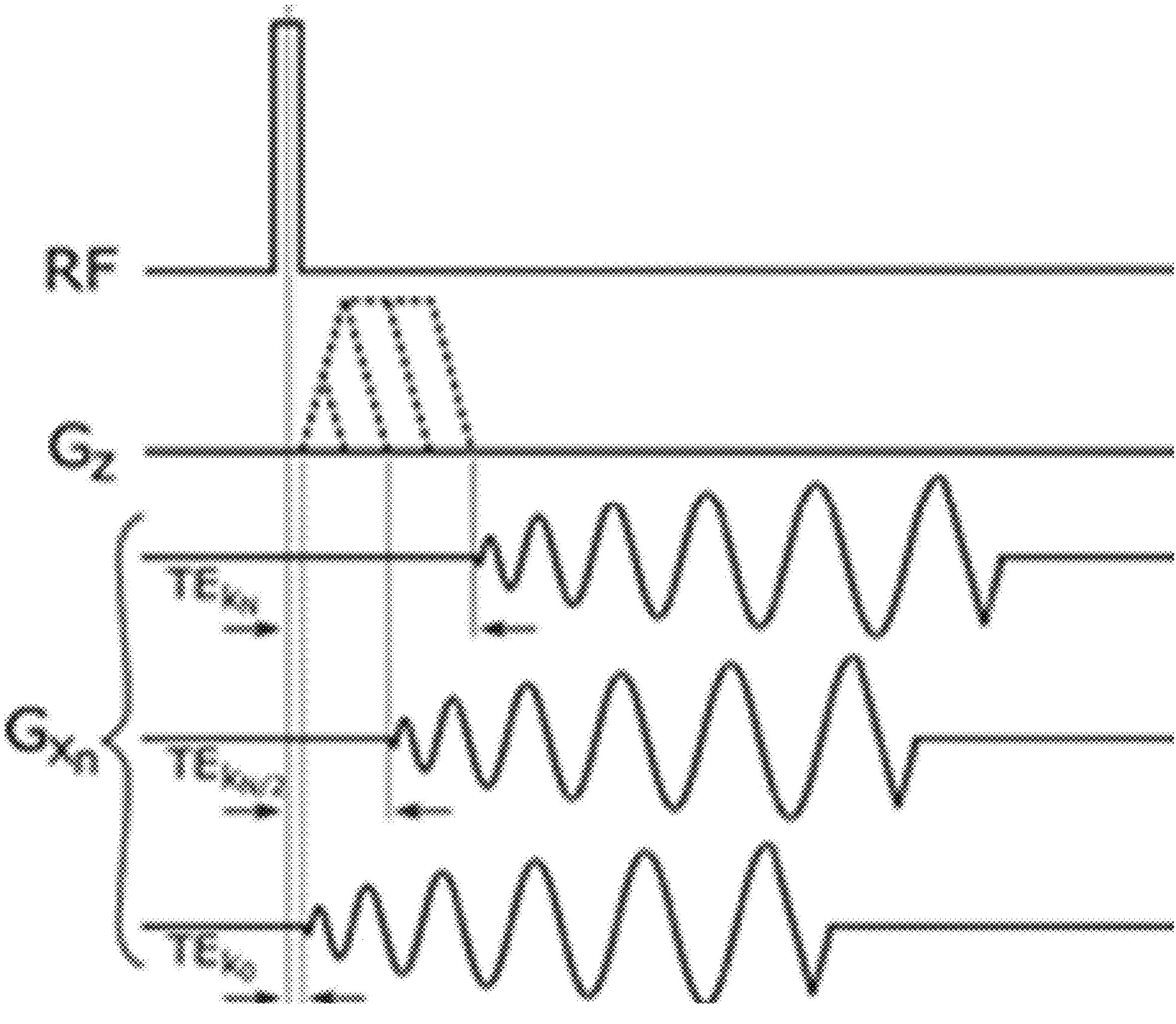
FIG. 6 is an illustration of the UTE VIBE sequence for magnetic resonance data acquisition.

FIG. 3 is a computer architecture diagram showing a computing system capable of implementing aspects of the present disclosure in accordance with one or more embodiments described herein. A computer 300 may be configured to perform one or more specific steps of a method and/or specific functions for a system. The computer may be configured to perform one or more functions associated with embodiments illustrated in one or more of the figures herein. For example, the computer 300 may be configured to perform aspects described herein for implementing the pulse sequences shown and for various aspects of magnetic resonance imaging and related signal and temperature monitoring shown in the figures. It should be appreciated that the computer 300 may be implemented within a single computing device or a computing system formed with multiple connected computing devices. The computer 300 may be configured to perform various distributed computing tasks, in which processing and/or storage resources may be distributed among the multiple devices. The data acquisition and display computer 150 and/or operator console 110 of the system shown in FIG. 1, and the controller 212 and/or MRI electronics 210 of the system shown in FIG. 2, may include one or more components of the computer 300.

As shown, the computer 300 includes a processing unit 302 ("CPU"), a system memory 304, and a system bus 306 that couples the memory 304 to the CPU 302. The computer 300 further includes a mass storage device 312 for storing program modules 314. The program modules 314 may be operable to perform functions associated with one or more embodiments described herein. For example, when executed, the program modules can cause one or more medical imaging devices, localized energy producing devices, and/or computers to perform functions described herein for implementing the pulse sequence shown in FIG. 3, the method shown in FIG. 1, and for various aspects of magnetic resonance imaging and related signal and temperature monitoring and analysis shown in the figures herein. The program modules 314 may include an imaging application 318 for performing data acquisition and/or processing functions as described herein, for example to acquire and/or process image data corresponding to magnetic resonance imaging of an area of interest. The computer 300 can include a data store 320 for storing data that may include imaging-related data 322 such as acquired data from the implementation of magnetic resonance imaging pulse sequences in accordance with various embodiments of the present disclosure.

The mass storage device 312 is connected to the CPU 302 through a mass storage controller (not shown) connected to the bus 306. The mass storage device 312 and its associated computer-storage media provide non-volatile storage for the computer 300. Although the description of computer-storage media contained herein refers to a mass storage device, such as a hard disk, it should be appreciated by those skilled in the art that computer-storage media can be any available computer storage media that can be accessed by the computer 300.

By way of example and not limitation, computer storage media (also referred to herein as "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 300. "Computer storage media", "computer-readable storage medium" or "computer-readable storage media" as described herein do not include transitory signals.

According to various embodiments, the computer 300 may operate in a networked environment using connections to other local or remote computers through a network 316 via a network interface unit 310 connected to the bus 306. The network interface unit 310 may facilitate connection of the computing device inputs and outputs to one or more suitable networks and/or connections such as a local area network (LAN), a wide area network (WAN), the Internet, a cellular network, a radio frequency (RF) network, a Bluetooth-enabled network, a Wi-Fi enabled network, a satellite-based network, or other wired and/or wireless networks for communication with external devices and/or systems.

The computer 300 may also include an input/output controller 308 for receiving and processing input from any of a number of input devices. Input devices may include one or more of keyboards, mice, stylus, touchscreens, microphones, audio capturing devices, and image/video capturing devices. An end user may utilize the input devices to interact with a user interface, for example a graphical user interface, for managing various functions performed by the computer 300. The input/output controller 308 may be configured to manage output to one or more display devices for displaying visually representations of data, such as display monitors/screens that are integral with other components of the computer 300 or are remote displays.

The bus 306 may enable the processing unit 302 to read code and/or data to/from the mass storage device 312 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology. The computer storage media may also represent secondary storage, whether implemented as hard drives or otherwise. Hard drive implementations may be characterized as solid state, or may include rotating media storing magnetically-encoded information. The program modules 314, which include the imaging application 318, may include instructions that, when loaded into the processing unit 302 and executed, cause the computer 300 to provide functions associated with one or more embodiments illustrated in the figures. The program modules 314 may also provide various tools or techniques by which the computer 300 may participate within the overall systems or operating environments using the components, flows, and data structures discussed throughout this description.

In MRI, the interactions between atomic nuclei are temperature dependent. Thus, MRI is well suited for non-invasive thermometry and is one of the main reasons MR guidance is used for focused ultrasound surgeries. Several MR physics parameters vary with temperature; T1, T2, and the diffusion of coefficient of water all increase, while the resonance of frequency of hydrogen nuclei and proton density (polarization) decreases.

T1 recovery results from dipolar magnetic field interactions between the two hydrogen protons in the same water molecule and also from inter-molecular interactions. To relax from an excited energy state to a lower state, the system must transfer energy at field fluctuations near the Larmor frequency. The field fluctuations are characterized by the frequency spectral density, J(w), which depends on motion as well. For example, free water exhibits fast motion and has a narrow J(w), so its T1 values are long. As with T2, T1 is also dependent on correlation time:

$$\frac{1}{T_1} = \frac{2\gamma^2 B_{loc}^2}{3} \frac{\tau_c(T)}{1 + \omega_o^2 \tau_c(T)^2}$$

For most MRI experiments, $$\omega_o^2 \tau_c^2 \ll 1,$$

so that $$\frac{1}{T_1} \propto \tau_c.\ \tau_c$$

is also inversely proportional to temperature, so T1 also approximately increases linearly with temperature within the clinical regime:

$$T = \frac{T_1(T) - T_1(T_{ref})}{m_1} + T_{ref}$$

A difficulty of T1 thermometry is caused by the tissue dependence of $m_1$. Unlike the α constant from proton-resonance frequency (PRF) methods discussed herein, which is tissue-independent, $m_1$ has high sample variability. T1 changes for non-fatty tissue are not always reversible, especially if tissue coagulation occurs. However, T2 thermometry also has a variable tissue dependent factor $m_2$.

While T1 is less sensitive to the $B_0$-field of the scanner compared to T2* and does not require a refocusing pulse compared to T2, it is very sensitive to a non-ideal slice profile which occurs when the small flip angle approximation does not apply. If the slice profile is non-ideal, then the T1 measurements can be erroneous. There are some methods for correcting for non-ideal slice profile, but they are still not fully reliable.

While work in T1-weighted thermometry may show promise for some applications, the repeatability of T1-weighted thermometry has not been investigated. T1-mapping has more potential to be repeatable and easier to calibrate, but suffers from requiring more acquisition time compared to T1-weighted thermometry. T1-weighted signal acquired with a volumetric spiral sequence decreases linearly with increasing temperature and can meet the clinical constraints in a repeatable way.

A challenge of T1-mapping is that at least two flip angles of data must be acquired per temperature point doubling acquisition time. Thus, acceleration techniques can be employed to make T1 thermometry viable.

This disclosure incorporates by reference U.S. Pat. No. 11,644,520 entitled "Systems and Methods for Magnetic Resonance Based Skull Thermometry." A portion of the discussion of the '520 patent is included here for ease of reference in regard to using T1 mapping to predict heating of areas around a region of interest (ROI), including a skull, when RF ultrasound therapies are used. With reference to FIG. 1, a flowchart illustrating steps of a method 100 for performing T1 mapping based thermometry is shown. At step 102, magnetic resonance (MR) data is by a variable flip-angle (VFA) T1 mapping sequence, MR data in an area of interest of a subject. The area of interest of the subject can be any part of the subject's body on which FUS is applied. As a non-limiting example, focused ultrasound (FUS) can be applied to the skull of the subject (i.e. a human patient receiving the treatment), and the area of interest can include corresponding cortical bone of at least part of the skull of the subject that is heated by the application of FUS to treat a selective portion of the brain of the subject. The skull has several important properties relevant for choosing MR sequence parameters. There can be very little water in the skull (which can impact proton density) which can decrease the amount of MR signal available. This can be mitigated using high SNR techniques. Water in the skull exists as free water and bound water. Bound water has a very short transverse relaxation time (T2) on the order of ~100 us. The echo time therefore many need to be on the order of ~100 us as well. Conventional MRI can be too slow to measure the transverse magnetization of bone before it decays away. Therefore a UTE (ultra-short echo time) sequence can be employed (e.g. a UTE sequence originally designed to measure lung tissue). On average, the skull is 5.58-8.17 mm thick, which can require good imaging resolution (e.g. a resolution of 5×5×5 mm). Further, its thickness varies from location to location and between patients. In order to capture skull heating in any location, a large field of view can be used in some embodiments of the present disclosure. For this purpose, a non-selective 3D sequence can be used in embodiments of the present disclosure to achieve a large field of view.

For temporal constraints, the skull's bone can be similar to a ceramic material functioning as a thermal insulator preventing heat flow from the scalp into the brain and vice versa, and it has a cooling time constant estimated to be on the order of minutes. Therefore, the temporal resolution should be short compared to the cooling time of the skull, for example some embodiments of the present disclosure can achieve a temporal resolution of 90 s or less. A table of values showing non-limiting examples of design/clinical parameters is shown in FIG. 2, including the above skull parameters and other design constraints of MRI-based thermometry.

Still with reference to FIG. 1, the MR data in step 102 can include a plurality of T1 values over time that include a first point in time and a second, later point time, where the acquisition of the MR data comprises applying an accelerated three-dimensional (3D) ultra-short (UTE) spiral acquisition sequence with a nonselective excitation pulse, and where the acceleration of the accelerated 3D UTE spiral acquisition sequence comprises the use of at least one of partial kz acquisition and variable density of spiral interleaves.

As a non-limiting example, the acquisition of MR data can be performed using the UTE VIBE sequence, which is illustrated in FIG. 3. The UTE VIBE sequence is a spoiled gradient echo sequence (GRE) sequence suitable for T1-based contrast imaging and is ultimately very fast. An alternative sequence that can be used in some embodiments of the present disclosure is the AWSOS (acquisition-weighted stack of spirals) sequence which uses a stack of spirals to accelerate in-plane data collection, variable-duration slice encoding, and a movable spiral readout achieving an echo time of 608 us. Differences between UTE VIBE and AWSOS include that the UTE VIBE is non-selective with a rectangular RF pulse, and the min TE is less than 100 us. The UTE VIBE sequence was developed for breath-hold UTE lung imaging. UTE VIBE has the following advantages for bone thermometry: (1) an ultra-short echo time limited only by the duration of a rectangular pulse; (2) a spiral readout enabling a highly efficient short readout duration which starts at the center of k-space; (3) non-selective (3D) excitation. While the present disclosure refers to UTE VIBE as an exemplary sequence, it should be understood that the use of other sequences is contemplated by the present disclosure.

The signal model is given by the GRE equation:

$$M_{xy} = S = M_o(T)\,\sin(\alpha)\frac{1 - e^{-T_R/T_1(T)}}{1 - \cos(\alpha)\,e^{-T_R/T_1(T)}}e^{-TE/T_2^*(T)} \quad \text{Eq. 1}$$

where $M_{xy}$ is the measured signal; $M_o$ is the thermal equilibrium magnetization; $\alpha$ is the flip angle; and $T_R$ is the repetition time. The $e^{-T_R/T_1(T)}$ term provides the T1-weighting on the signal. If the TE is sufficiently short, then the $e^{-TE/T_2*(T)}$ term is negligible. T1 can then be estimated by using linear least squares fitting on Eq. 1 from signal from two flip angles. The two optimal flip angles are calculated by using propagation of errors to minimize an expression of uncertainty in quantitative VFA T1 mapping occurring when the signal is 0.71 of the Ernst angle signal (maximum signal).

There are at least two ways to attain a short RF: using half-sync excitation or using a rectangular, non-selective pulse. However, if using half-sync excitation, two half-sync RF pulses are needed to achieve a good slice profile doubling scan time. UTE VIBE can attain a 120 us rectangular pulse for a 35° flip angle (shorter for lower flip angles). The echo time with this kind of pulse is calculated from the center of the rectangular pulse with 20 us for switching the coil from transmit to receive leading to a minimum 80 us TE (60 us+20 us). The center of the rectangular pulse represents the average amount of T2 decay over time. The sequence also has an RF spoiler which prevents coherences from previous TR (stored in Mz) from contributing to the current TR's signal.

The $G_z$ spatial encoding is one of the strengths of this sequence in minimizing echo time. Z-information is phase-encoded with a $G_z$ gradient after the RF pulse and before the readout spiral. Each $T_R$ corresponds to a selected k-z plane in k-space, so that the third dimension is sampled traditionally in the Cartesian way, whereas k-space in $k_x$, $k_y$ dimensions is sampled using spirals. Thus, the sampling trajectory is a stack of spirals. The duration of the $G_z$ gradients starts at 0 us for kz=0 and increases to the maximum duration set by the desired z-resolution. The variable duration of the $G_z$ gradient leads to a variable echo time.

Figure 7A:
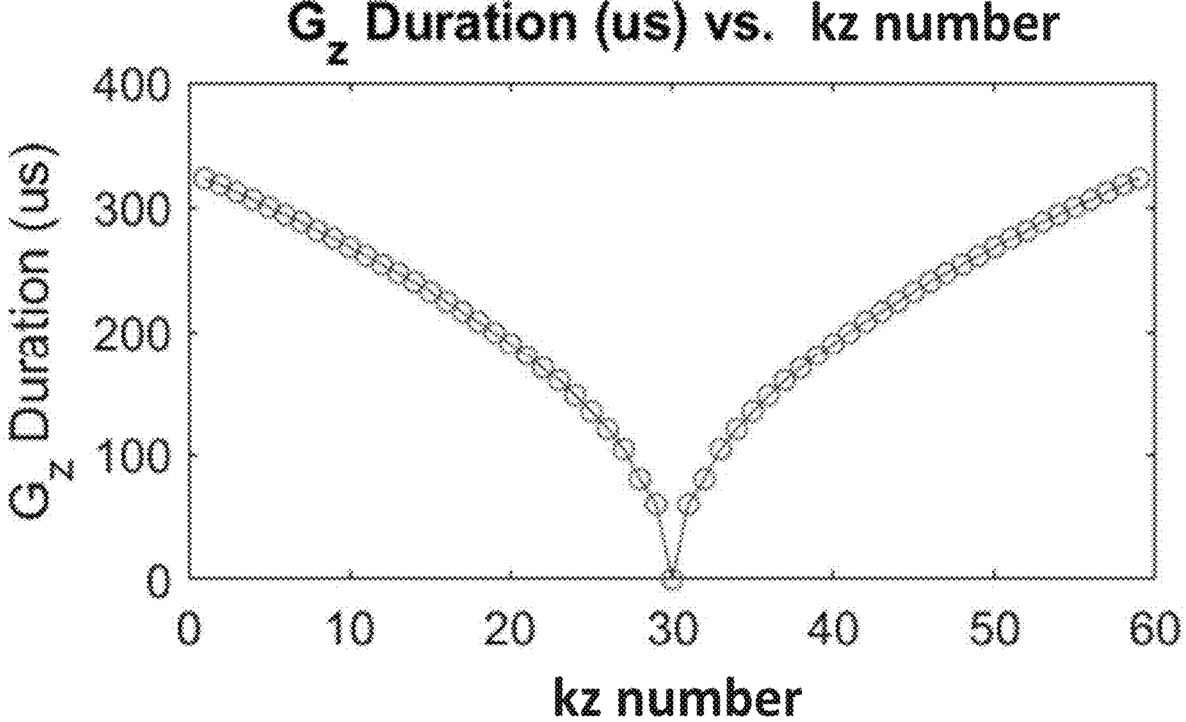
Figure 7B:
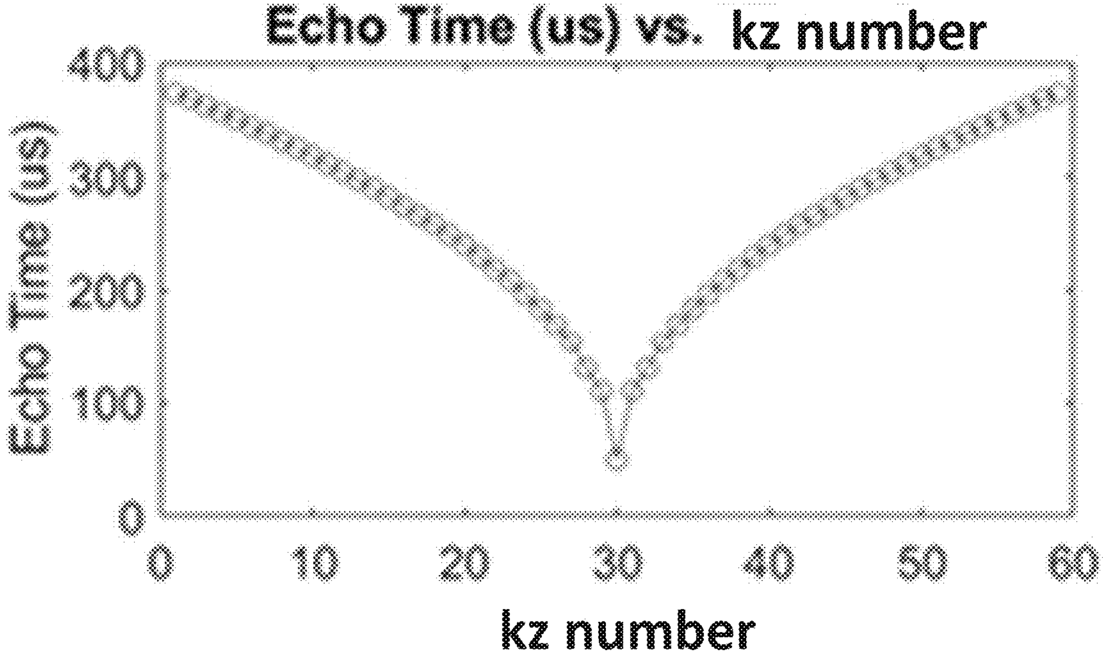

The echo time depends on the length of the $G_z$-phase encode gradient and is thus variable as described above and shown in FIG. 7A. Minimum echo time (minTE=50 us) occurs when there is no $G_z$ gradient (at the center of kz space); the readout spirals are played immediately after the RF pulse. For a non-limiting example embodiment of the UTE VIBE, the maximum echo time is 373 us for the highest kz plane of data. Because most of the signal energy comes from the center of k-space, the effective echo time is close to the minimum echo time. However, variable echo time leads to blurring as the longer echo time corresponds to more T2-decay (attenuation) of the higher spatial frequencies (FIG. 7B), in which the signal depends on the echo time, as described originally by Qian et al:

$$S(t_d) = S(0)\ \exp\left(-\frac{t_d - t_{d,min}}{T_2}\right)$$

where S(TE($k_z$)) is the signal intensity after a z-encoding of duration td.

Figure 8B:
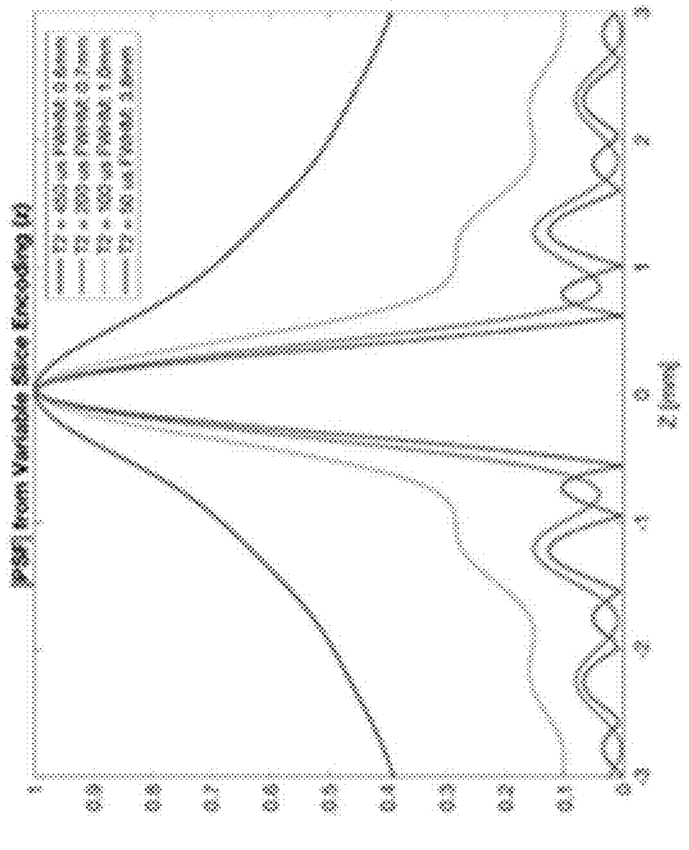
Figure 8A:
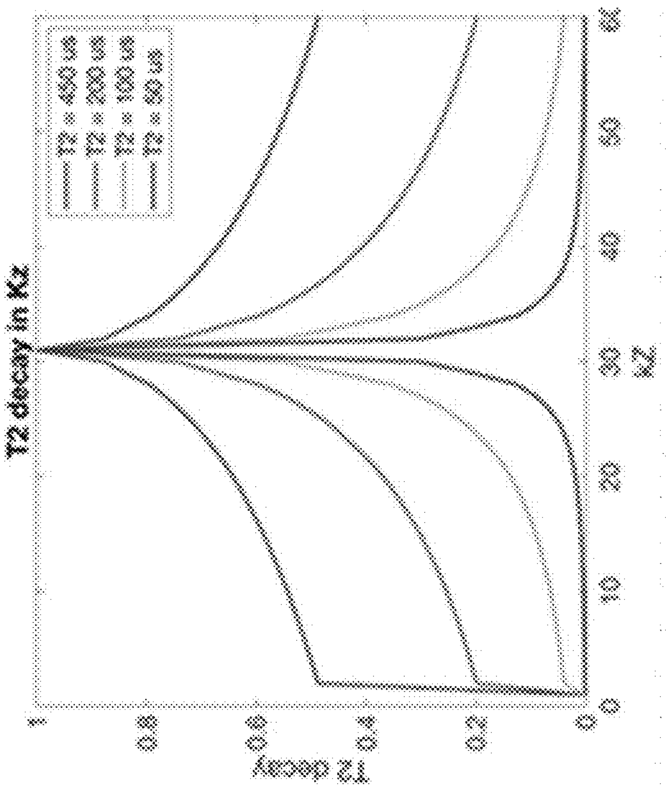

For species with a T2 of 450 us, a blur of 0.6 mm is predicted to occur for UTE VIBE which meets the goal for human imaging and this blur is illustrated in FIGS. 8A-8B.

Figure 9:
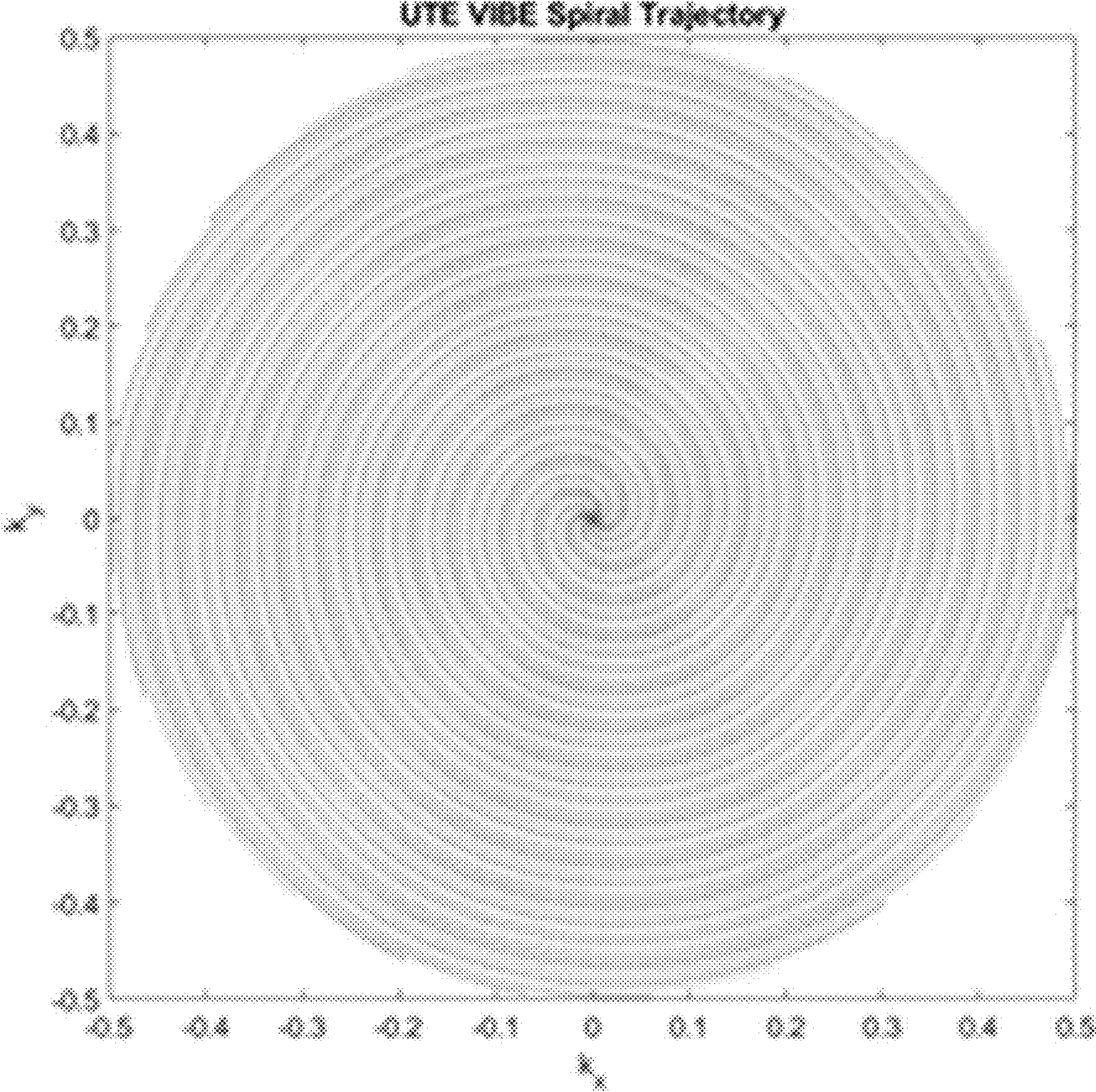
FIG. 9 illustrates a non-limiting example of a UTE VIBE K-space Trajectory. Uniform spiral density.

Though spirals can be technically difficult to implement on a scanner, can require special reconstruction techniques, and can be sensitive to off-resonance, they have many advantages, such as (1) reducing acquisition time due to efficient k-space coverage; (2) having a large SNR by starting acquisition at the center of k-space, which is also an advantage for ultra-short echo time sequences; (3) being robust against motion in dynamic MRI; (4) allowing real-time MRI with high in-plane resolution; and (5) being less sensitive to aliasing. For these reasons, spirals are a viable option for bone thermometry, which requires ultra-short echo time, high SNR, and rapid image acquisition. The k-space spiral trajectory as implemented in a non-limiting example of an MRI scanner that can be used in an embodiment of the present disclosure is shown in FIG. 9.

Blurring from spiral sampling during readout can occur due to different amounts of T2 decay modulating the $k_x$, $k_y$ signal in the spiral trajectory:

$$S(k_x(t), k_y(t), k_z(t)) = e^{-t/T_2^*} \int\int\int p(x, y, z)\ e^{-j(x*k_x(t)+y*k_y(t)(z(k_z(t))}dxdydz$$

Figure 10:
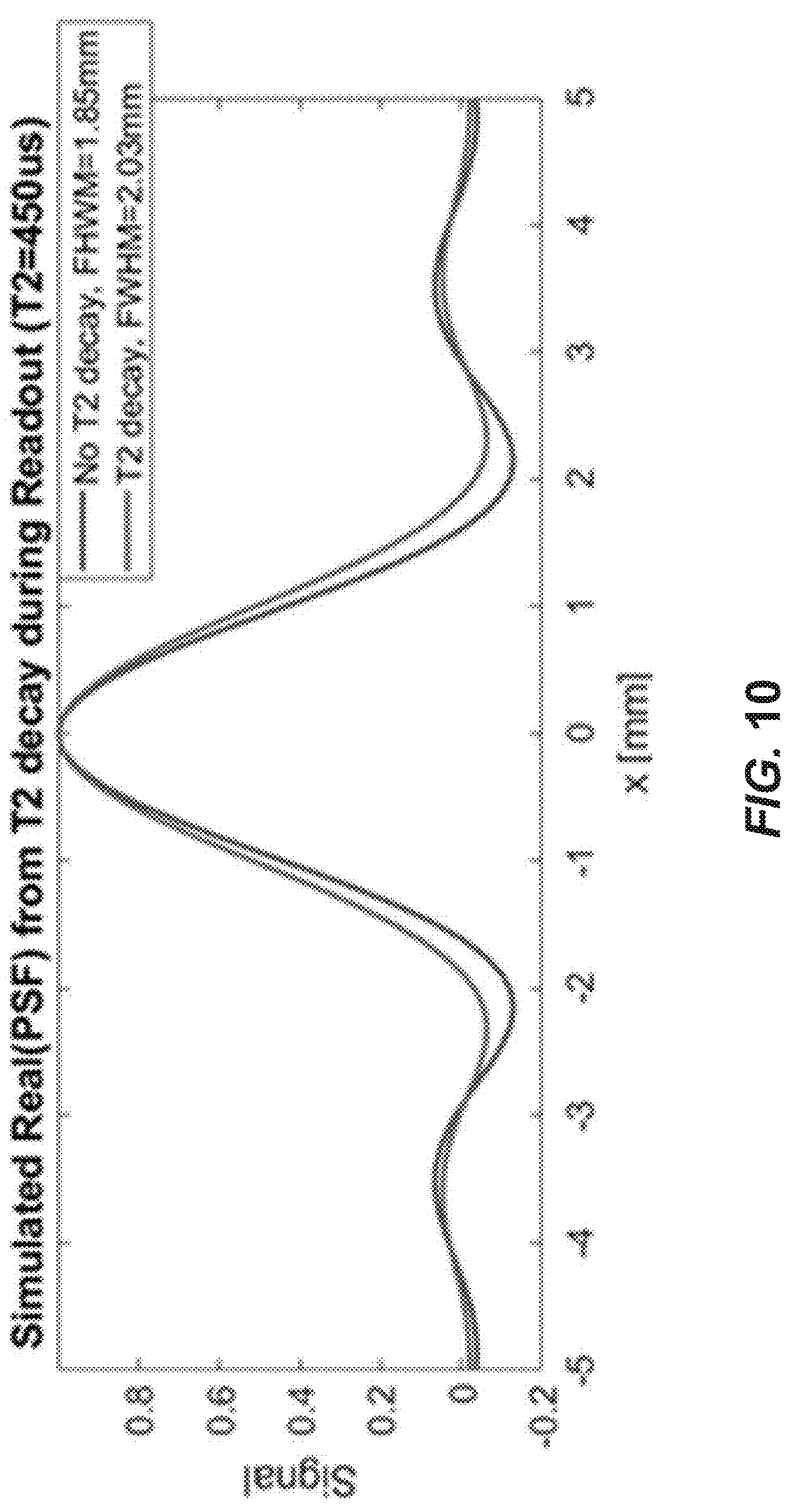
FIG. 10 illustrates the effect of T2 decay during readout.

In the case for a T2* of 450 us, there FWHM changes from 1.85 mm (no decay) to 2.03 mm (9.73% difference). This effect is illustrated in FIG. 10, which illustrates the effect of T2 decay during readout.

Figure 11:
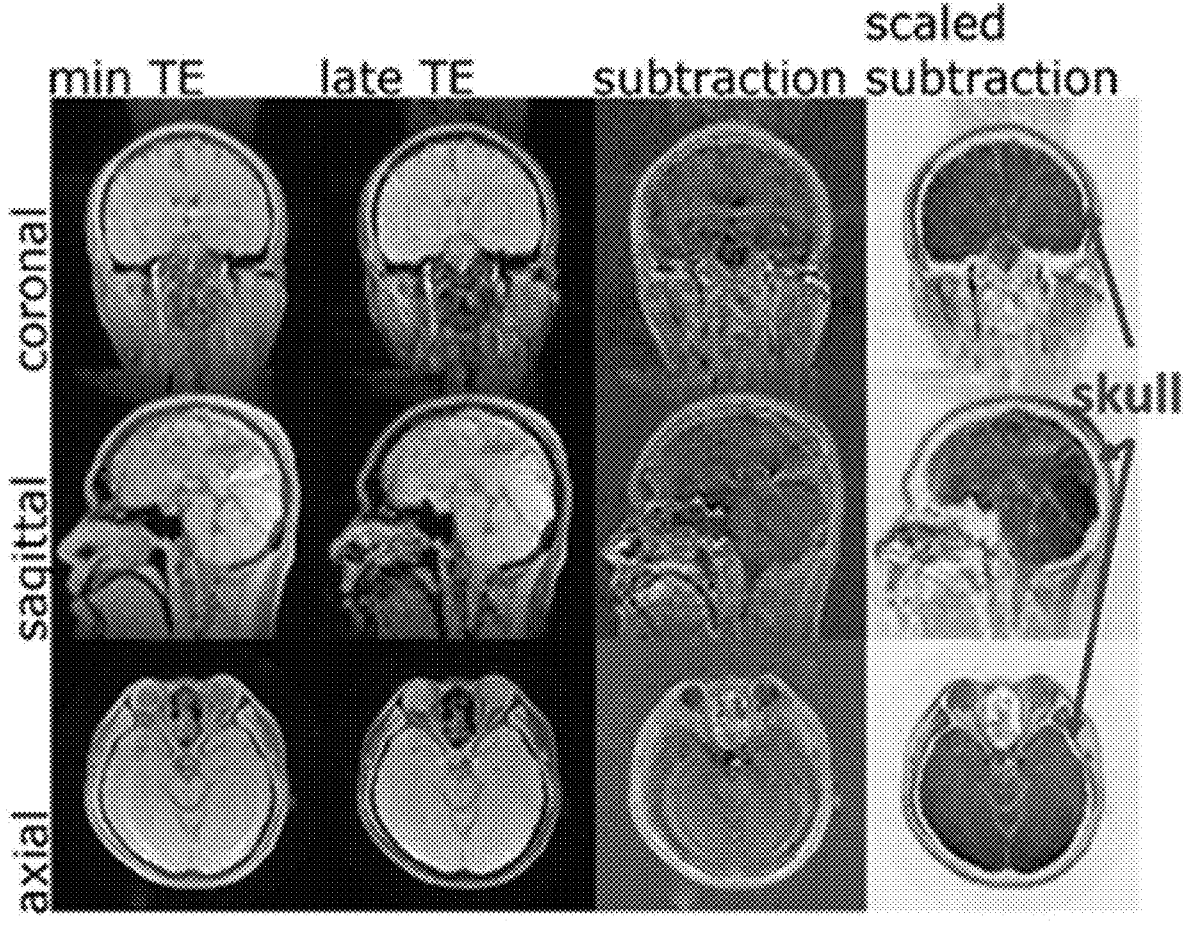
FIG. 11 illustrates an example of whole-head in-vivo UTE data acquired in 67 seconds. TR=10 ms. TE=50-370 us. Flip angle 5°. FOV 240 mm3. Resolution (2.5×2.5×3.75 mm3). 98 interleaves of 1.0 ms duration each; 67-seconds acquisition time. Imaging was performed using a 12-channel head RF coil. The second image was obtained at TE of 5.1 ms for late-TE comparison.
Figure 12:
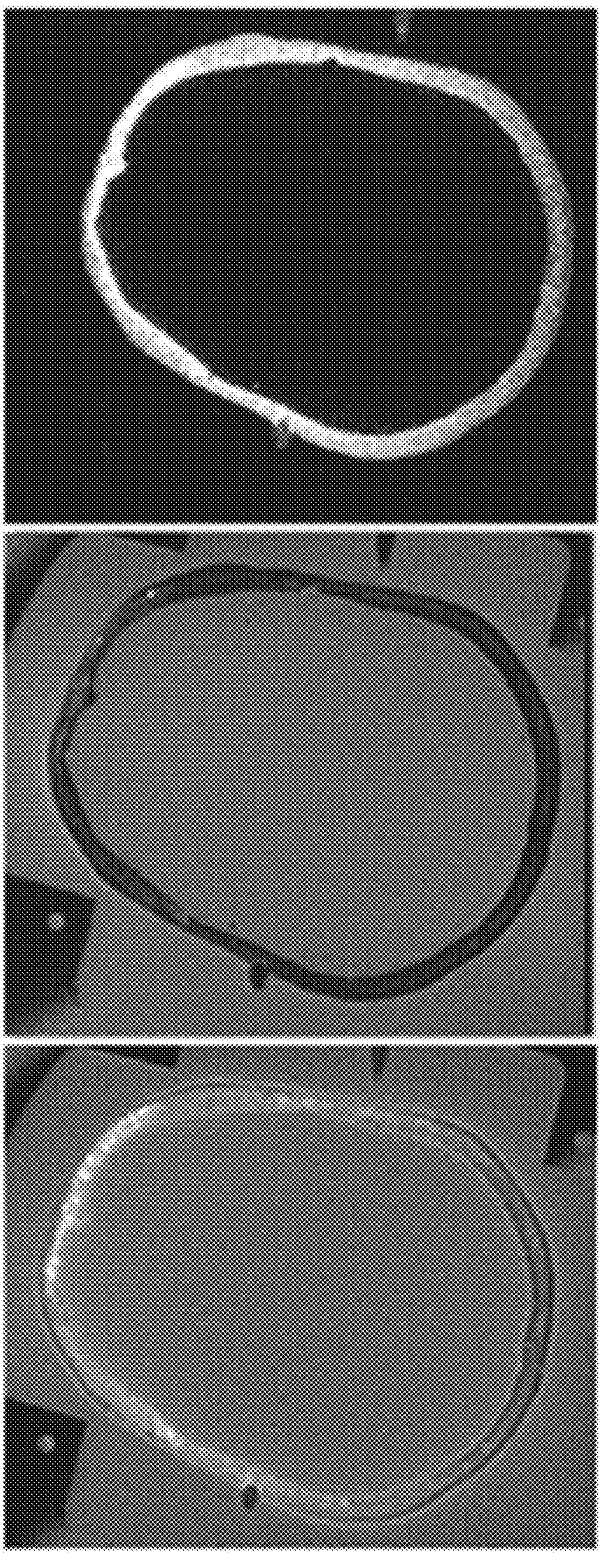
FIG. 12 illustrates ex-vivo skull high-resolution UTE data. TR=11 ms. $TE_{min}$=50 us. Flip angle 20°. FOV 333×333×154. Resolution (0.8 mm3). X interleaves of 0.5 ms duration. 29-min. acquisition time. Imaging was performed using a Tx/Rx CP Head Coil. The second illustration corresponds to data obtained at TE of 2.5 ms for late-TE comparison.

The UTE VIBE has the advantage of imaging a large volume (240 $mm^3$) under 90 s (FIG. 11) making it rapid enough for skull thermometry during MRgFUs. For comparison, FIG. 12 illustrates MR data acquired from an ex vivo skull at high resolution.

Though T1-mapping thermometry can take twice as long as T1-weighted thermometry, the T1 vs. temperature trend is much more reliable and linear. By using the advantages of spiral MRI, it is possible to accelerate T1-mapping to meet the clinical constraints (e.g. the non-limiting constraints illustrated in FIG. 5).

Again referring to FIG. 4, the MR data acquisition sequence used in step 102 can be accelerated to conform to clinical constraints (e.g. the constraints shown in FIG. 2). In some clinical settings, it is desirable that the thermometry of a patient's head in the water bath should not take more than 90 s. FIG. 5 shows a resolution of as a target, (≤5×5×5 mm), however, embodiments of the present disclosure are capable of higher resolutions (e.g. 1.9×1.9×5 mm), as it is desirable to have a resolution high enough to develop a satisfactory image of a an average skull, which has an average thickness of 6.5-7.1 mm. To achieve the 90 s goal for two flip angles, the time per kz-encoding (200/5=40 kz encodings in total) can be 45 s/40=1.13 s per kz encode. Temporal resolutions different than 90 s are contemplated by the present disclosure, and it is therefore contemplated that the time per kz-encoding can be different than 1.13 s per kz encode in different embodiments of the present disclosure.

The acceleration method can be any suitable acceleration method that can generate T1 mapping information within the desired clinical constraints. For example, partial Fourier imaging can be applied. Partial Fourier imaging takes advantage of the conjugate symmetry of k-space applicable when the object is real or there are no phase errors, where $|k(x,y)|=|k(-x,-y)|$ and $\varphi_{x,y}=-\varphi_{-x,-y}$ (same amplitude, opposite phase). In theory, only half of k-space needs to be acquired, but in practicality, phase errors do occur from $B_0$-field inhomogeneities, concomitant gradients, and eddy currents. Thus, partial Fourier sampling can require acquisition of 60% or more of k-space. For UTE VIBE, 6/8 kz partial Fourier sampling was selected as a non-limiting example, and therefore the bottom 25% of k-space was not collected and scan time was reduced by approximately 25%.

Another non-limiting example of an acceleration technique that can be used is variable density spiral design. Variable density spiral design samples the center of k-space at the Nyquist limit but under-samples the outer k-space regions reducing acquisition time. Because the center of k-space is fully-sampled and can contain most of the energy, under-sampling in outer k-space can lead to fewer artifacts than under-sampling uniformly. As spiral aliasing results in blurring instead of replicant overlap, under-sampling in the high spatial frequencies can lead to benign artifacts.

Again with reference to FIG. 4, step 104 includes determining a temperature change in the cortical bone based at least in part on a mathematical relationship established by T1 mapping thermometry produced according to the T1 mapping sequence. The temperature change in the cortical bone that occurs between the first point in time and the second point in time, can be determined, where the temperature change is caused at least in part by a change in the FUS.

Conventional MR thermometry does not work in the skull due to its ultra-short T2, so T1-based thermometry is used. Skull thermometry imaging should be relatively fast to capture temperature changes in clinically relevant timescales (e.g. the 90 s timeframe illustrated in FIG. 5). It is also beneficial for skull thermometry to be volumetric in order to detect heating anywhere in the skull, and have a short echo time (<100 us) to enable the imaging of bone. T1 is linear with temperature in cortical cow bone and can thus be calibrated to temperature. However, existing methods have not been demonstrated under clinical constraints and have a long acquisition time (8 minutes).

Though T1-mapping thermometry can require twice as many acquisitions as T1-weighted thermometry, the T1 vs. temperature trend should be much more reliable and linear. By using the advantages of spiral MRI, it is possible to accelerate T1-mapping to meet the clinical constraints (e.g. the constraints in FIG. 5).

Figures 13A, 13B:
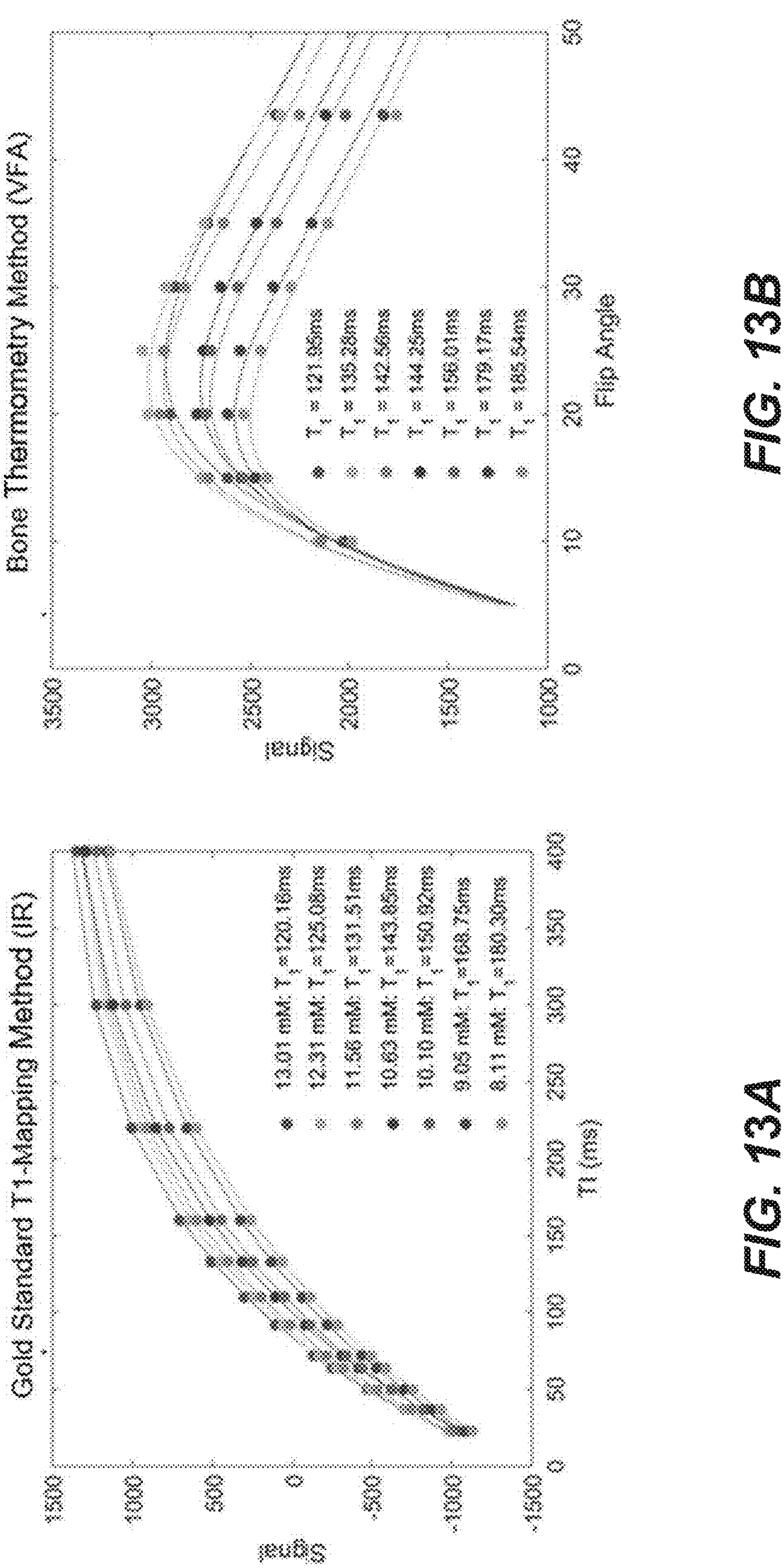
Figure 13C:
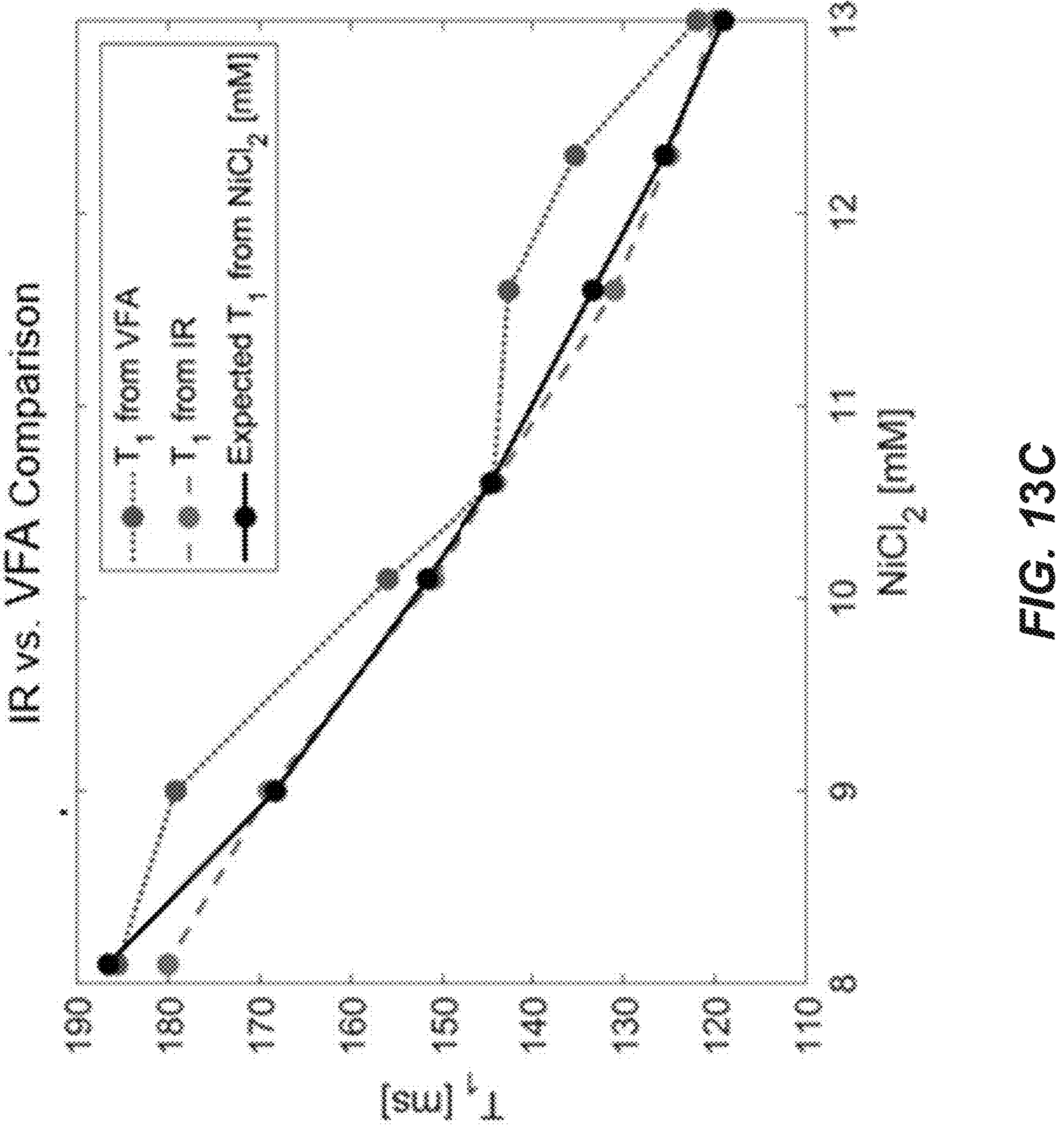

$T_1$ values from the UTE VIBE VFA method and the IR method were compared in FIGS. 10A-10C. The IR values (shown in FIG. 10C in solid black) were much closer to the expected $T_1$ based on $NiCl_2$ concentrations (mM). The mean difference in $T_1$ between VFA and IR was 6.39 ms (4.46% difference). The VFA values illustrated in FIG. 13C (solid line) are less linear. However, IR may not be practical for UTE imaging; in IR, a 180° magnetization inversion must be achieved. Materials with short T2 such as cortical bone undergo relaxation during the inversion pulse thus making IR inefficient. The noisy VFA-T1 measurements can be corrected by performing a B1 map to measure the actual flip angles rather than relying on the potentially erroneously prescribed flip angles. Overall, the UTE VIBE VFA method can be sensitive to $T_1$ with 5% error, enabling T1-mapping thermometry of cortical bone in step 104. This T1-mapping thermometry has several useful clinical applications, including allowing the person or system administering FUS to a patient to either increase or decrease the intensity of the FUS and therefore determine the optimal level of FUS to apply to a patient to both treat the patient's condition and avoid unintentional damage to the surrounding tissue.

The techniques described herein can be applied to portions of the brain that correspond to diseases including Parkinson's disease, essential tremor, neuropathic pain, depression, and obsessive-compulsive disorder, although the use of FUS to treat other conditions, while using T1 mapping thermometry, is contemplated by the present disclosure.

Another method to consider in assessing heating issues in MRI assisted thermometry is that of proton resonance frequency (PRF) analysis. One historical study by Wang [7] regarding this technique explained that PRF based phase-shift imaging is a highly accurate method of monitoring temperature in applications with focused ultrasound or even with a laser. Wang studied the sensitivity of MR based temperature mapping at high MR fields and found encouraging results that expand upon earlier research showing that there is a linear relationship between temperature change and proton chemical shift as discussed by Botnar et al. [8] Wang [9] discusses a method and system for calibrating a temperature coefficient by fitting a linear relationship between actual temperature and phase difference. Wang explains using techniques such as linear regression to calibrate a temperature coefficient, for a region of interest (ROI) subject to focused ultrasound with MR monitoring, wherein the temperature coefficient is based on phase changes and temperature differentials.

First Embodiment and First Test Results

In one First Embodiment, this disclosure illustrates how temperature monitoring plays an essential role in transcranial MR-guided focused ultrasound (tcMRgFUS) surgery for measuring thermal dose at the target. Unintended heating of the skull and nearby brain tissue is not currently monitored. By using a two-echo 3D spiral ultra-short echo time (UTE) sequence, we demonstrate a method that combines T1-mapping and proton resonance frequency (PRF) shift thermometry to simultaneously monitor skull and brain heating and validate it in an in vitro model.

MR-guided Focused Ultrasound (MRgFUS) is a minimally invasive method of treating medically-refractory essential tremor and tremor-dominated Parkinson's disease. Acoustic waves through the skull focus on the target brain tissue causing ablation with temperatures above 60° C. [1], and the thermal dose is monitored using MR thermometry. However, the skull absorbs substantial energy [2], which may lead to pain and damage to the skull [3] and nearby brain tissue. However, skull heating lacks a direct, noninvasive monitoring method, forcing the surgeon to rely entirely on computational modeling to assess the risk.

The prevailing method for thermometry in aqueous tissue, proton resonance frequency (PRF) shift, is based on a temperature-dependent phase shift, which increases with TE [4]. However, PRF is not practical in short-T2 tissues such as bone, so the variable flip angle (VFA) method for T1 mapping is an alternative. Han et al. quantified temperature-dependent T1 changes in cortical bone using ultra-short echo time (UTE) MRI [5]. Combining these two thermometry methods using a two-echo rapid UTE sequence has the potential to simultaneously monitor unintended skull and brain heating in transcranial Magnetic Resonance-Guided Focused Ultrasound (tcMRgFUS) treatments. This work used a two-echo 3D spiral UTE sequence for thermometry with both the VFA and PRF methods. To demonstrate its feasibility, this disclosure utilized bone-gel phantoms and conducted experiments under heating using a water bathing and focused ultrasound (FUS).

Unintended heating of the skull and nearby brain tissue is not currently monitored in tcMRgFUS. This disclosure demonstrated a method that conducts simultaneous thermometry of the skull and brain with a two-echo 3D spiral UTE sequence and validates it in vitro.

First Embodiment Example Implementations and Corresponding First Embodiment Results The following description includes discussion of example implementations of the above described First Embodiment of the present disclosure, and corresponding results. Some experimental data are presented herein for purposes of illustration and should not be construed as limiting the scope of the disclosed technology in any way or excluding any alternative or additional embodiments Methods:

All experiments were performed in a 3T scanner (MAGNETOM Prisma, Siemens Healthcare, Erlangen, Germany). For the water-bath experiment, a product transmit/receive head coil was used. Parameters used for the 3D UTE sequence included time to repetition (TR) 30 ms, time to echo (TE) 0.05/10 ms, flip angles (FA) 15°/30°, matrix size 96×96×10, resolution 1.35×1.35×8 $mm^3$, spiral interleaves 64, radio frequency (RF) pulse duration 60 μs, acquisition time (TA) per flip angle (FA) 36 s. As the cooling process was very slow, the scan was paused between temperature samples for about 20 minutes.

Figure 14:
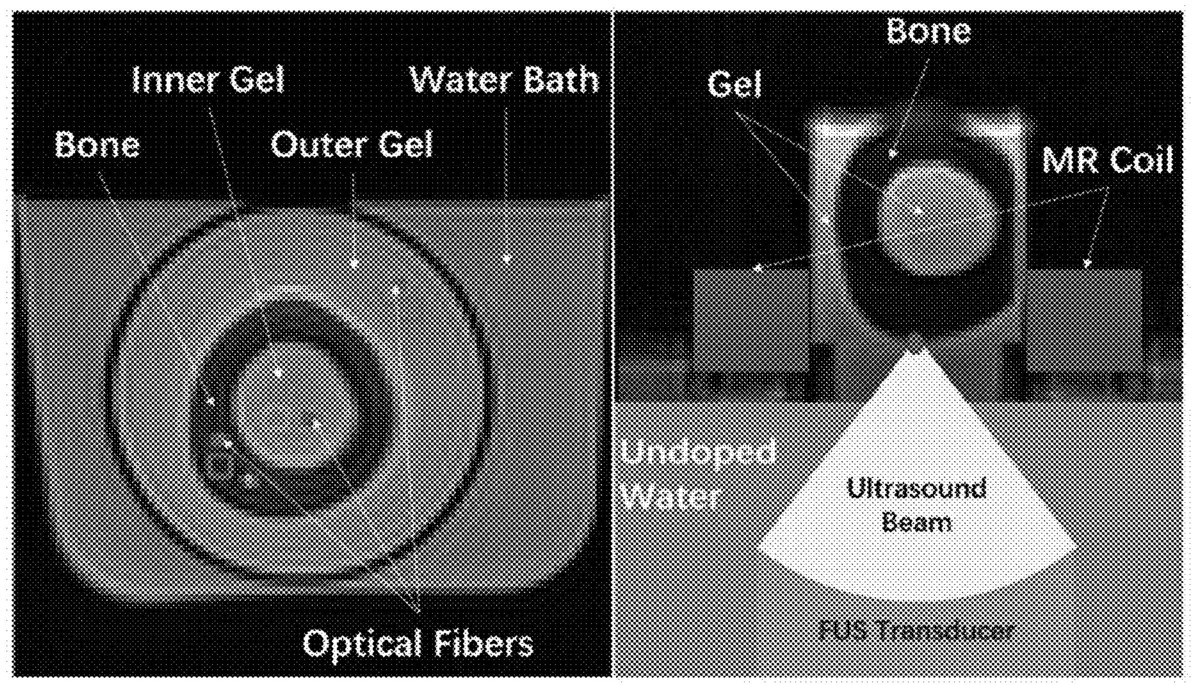
FIG. 14 illustrates the cortical bone without marrow was surrounded by agar gel both inside and outside the bone. For the water-bath experiment (left), the bone-gel phantom was immersed in hot water during the cooling process. 4×4 pixel ROIs in the bone (red), the inner gel (green), and the outer gel (blue) were selected near each optical fiber. For the FUS experiment (right), the bone-gel phantom was in a plastic cylinder with no bottom. The ultrasound beam reached vertically the boundary between the bone and the gel. The ring-shaped MR coil surrounded the cylinder.

A phantom was made in a plastic bottle with agar gel surrounding an ex-vivo bovine femur with the marrow removed and kept in refrigeration before use. Three optical fibers were fixed inside the cortical bone through a drilled hole, the inner gel, and the outer gel respectively (FIG. 14, left). The phantom was immersed in hot water (~65° C.). The scan was not started until the thermal steady state was reached, which was based on temperature reading from an optical thermometer (L201, Rugged Monitoring, Quebec, Canada).

The VFA and PRF methods were used for the data from the short and long echoes respectively. Both methods were applied to regions in the inner and outer gel. Only the VFA method was applied to the bone. The size of each ROI was 4×4 pixels. The VFA T1 values were smoothed over four cycles for display. As the PRF data had twice as many samples as the VFA data (two flip angles), smoothing was over eight cycles for PRF.

For the FUS experiment, a product flexible surface coil was used and some parameters were altered to adapt to the hardware: time to echo (TE 0.07/10 ms), radio frequency (RF) pulse duration 100 μs. The phantom was placed in a plastic cylinder with no bottom, so that the ultrasound could penetrate the gel and reach vertically the bone-gel boundary (FIG. 14, right).

An optical fiber was inserted in the gel with a ~2 cm distance to the acoustic focus to measure temperature nearby. The scan covered three FUS sonications, each of which spanned 114 s with a power of 5 W, as well as the cooling periods. In contrast to the water-bath experiment, VFA was applied only to a 3×5 pixel ROI in the bone, and PRF was applied only to a 3×5 pixel ROI in the gel. Both ROIs were selected near the boundary. Thus, it could be assumed that the temperature for the gel by PRF was approximately the same as for the bone.

Figure 15:
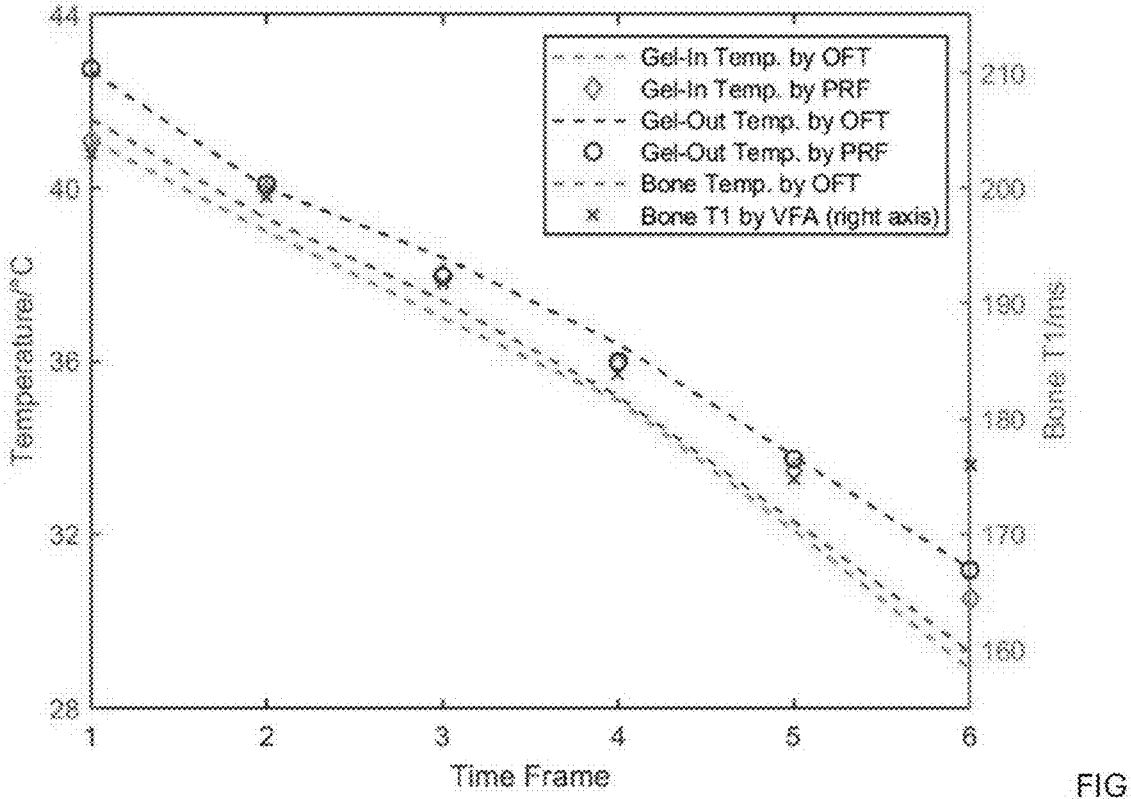
FIG. 15 illustrates a water-bath experiment according to this disclosure. Temperature measured by the optical fiber thermometer (OFT) and PRF was plotted versus T1 values calculated by VFA. All data were smoothed over four scans and averaged across the corresponding 4×4 pixel ROIs described in FIG. 14.
Figure 16:
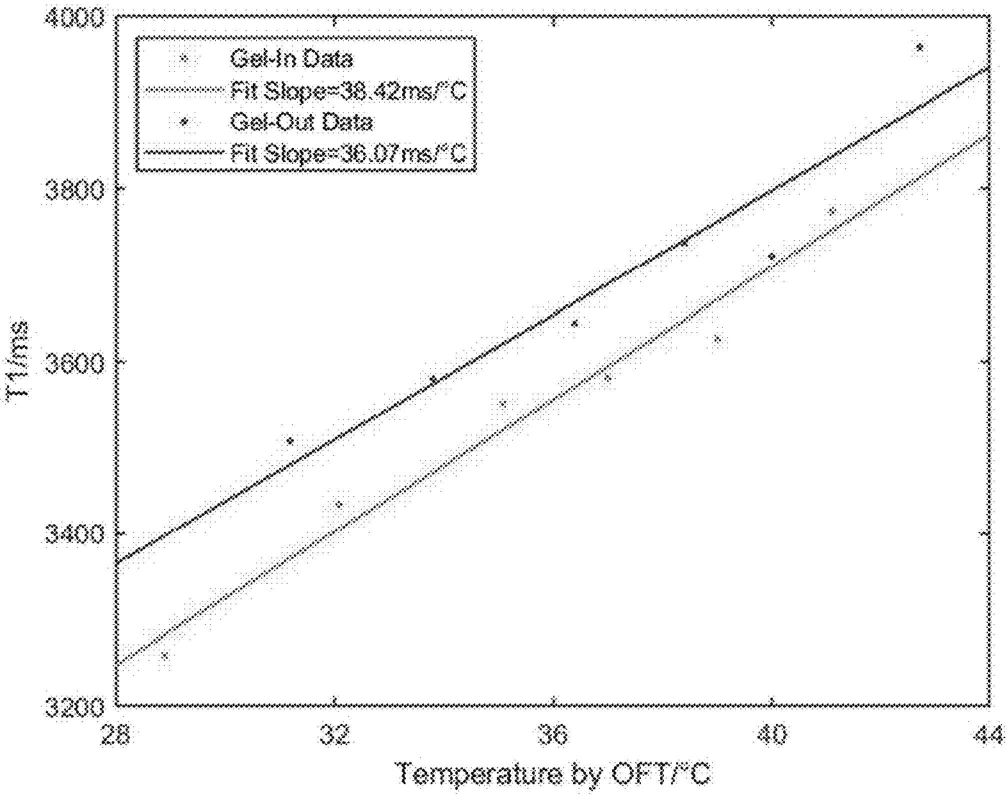
FIG. 16 illustrates another water-bath experiment. The linear relation between T1 and temperature values in gel was plotted. The T1 values were calculated by VFA. The temperature values were measured by OFT. The slopes of the fits were 38.42 ms/° C. and 36.07 ms/° C. for the inner and outer gel respectively. All data were smoothed over four scans and averaged across the corresponding 4×4 pixel ROIs described in FIG. 1. The slope of the fit for the bone was 2.51 ms/° C. (not shown).
Figures 17A, 17B:
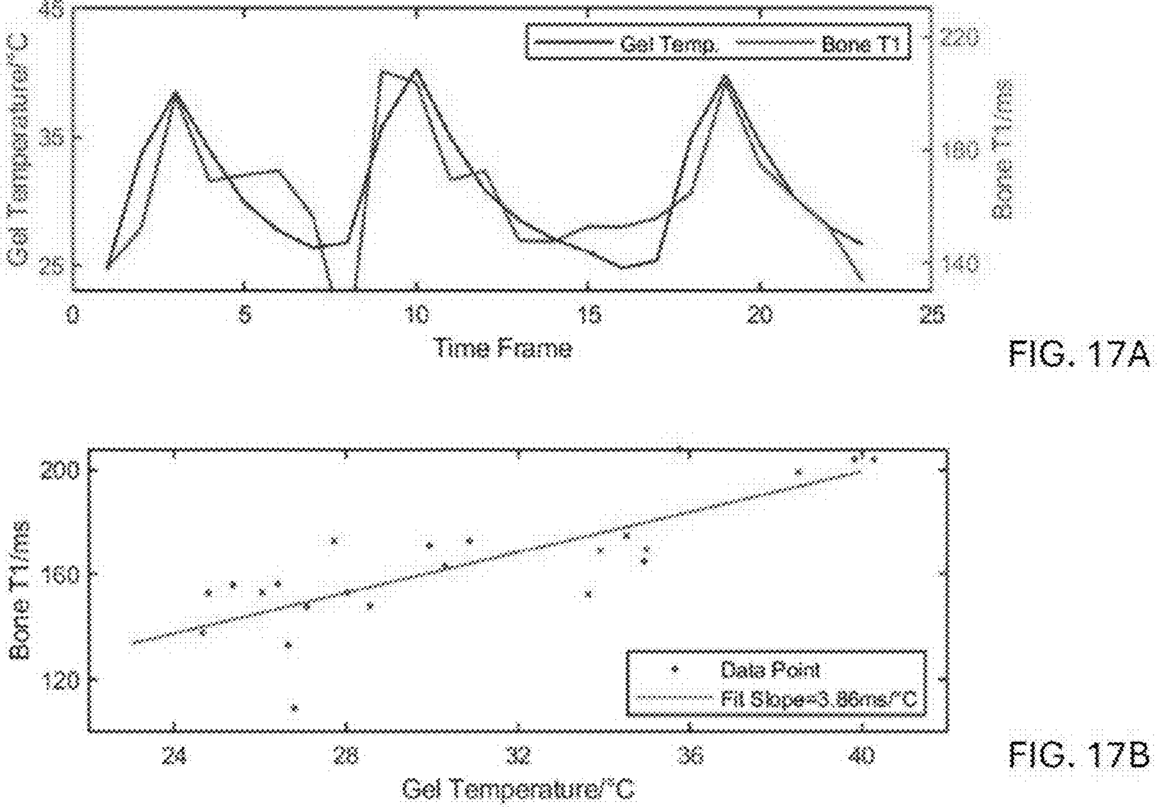
FIG. 17A illustrates FUS experiment. The top figure displays the gel temperature by PRF and the bone T1 by VFA. Both data sets were averaged across a 3×5 pixel ROI selected on the boundaries of the bone and the gel. The PRF data was also averaged over every two frames to be compatible with the VFA data.
FIG. 17B is the bottom figure and displays the fitting result based on this data with the assumption that the bone and the gel shared the same temperature values. The slope of the fit was 3.86 ms/° C.

Results:

In the water-bath experiment, the PRF results from the inner and outer gel were within a 1.5° C. deviation from the values from the optical fiber thermometer (OFT). The linear relationship between the OFT temperatures and the T1 values of the bone by VFA could be clearly observed (FIG. 15). By first-order polynomial fit over the OFT values and the T1 values in the gel, the slopes were 38.42 ms/° C. and 36.07 ms/° C. for the inner and outer gel respectively (FIG. 16). The slope for the bone was 2.51 ms/° C. (not shown). In the FUS experiment, the PRF results from the gel and the VFA results from the bone displayed a linear relationship of FIG. 17A. By fitting between them, a slope of 3.86 ms/° C. was calculated, which is comparable to the value, 2.51 ms/° C., in the water-bath experiment (FIG. 17B).

A two-echo 3D spiral UTE sequence was used for simultaneously monitoring the temperature of bone and agar gel. By the water-bath experiments, a linear relationship between the VFA T1 values and the ground truth temperatures in gel was demonstrated with very good agreement. By the FUS experiment, a linear relationship between the (assumed) ground truth temperature and the VFA T1 in bone was determined, with evidence that the slopes of the fits were comparable to each other between these two experiments. In conclusion, this is a promising method for simultaneously measuring off-target skull and brain heating in tcMRgFUS. Future work includes accelerated imaging, improving SNR, and in vivo testing.

Second Embodiment and Second Test Results

Unintended heating of the skull and nearby soft tissue during transcranial MR-guided Focused Ultrasound surgery needs to be monitored. However, T1-based thermometry in cortical bone may be biased with variable flip angles. One non-limiting aspect of this disclosure was to correct flip angles to improve the T1 mapping accuracy in cortical bone. In phantom and human studies, B1 maps of soft tissue were measured with a phase-sensitive method, extrapolating from which B1 maps of bone were generated and were used to correct flip angles for T1 mapping. One non-limiting theory of this disclosure shows that extrapolated-B1 correction with a phase-sensitive method should improve accuracy and homogeneity of T1 maps in cortical bone and is promising in monitoring unintended heating in the skull and nearby brain tissue during transcranial MR-guided Focused Ultrasound surgery.

Monitoring the temperature of unintended heating in the skull and adjacent soft tissue during transcranial MR-guided Focused Ultrasound (MRgFUS) surgery presents a major challenge, demanding extensive spatial coverage and frequent measurements. A method using a dual-echo 3D spiral ultra-short echo-time (UTE) sequence has been introduced to tackle this issue, which combines the variable flip angle (VFA) T1 mapping technique for MRI thermometry in cortical bone and the proton resonance frequency (PRF) shift method for soft tissue. [8]

The VFA method requires accurate flip angles. Therefore, it may be biased by the spatial inhomogeneity of RF transmit field [9]. B1 mapping methods have been proposed including the dual-angle method [10], the actual-flip-angle method [11], and the phase-sensitive method [12]. Multiple studies [13, 14, 15] comparing these methods have been published suggesting that the phase-sensitive method demonstrates excellent accuracy and precision particularly in a low signal-to-noise ratio (SNR) environment. However, its efficacy is constrained by the assumption of minimal relaxation during RF pulses, rendering it less suitable for direct use in short-T2 tissues such as cortical bone.

In one non-limiting embodiment, this study proposes a method aimed at extrapolating the phase-sensitive B1 map of adjacent soft tissue into cortical bone, thereby facilitating the correction of its T1 map. Phantom and volunteer experiments were conducted for validation.

Method:

The phase-sensitive method uses a non-selective RF pulse that is composed of a pulse about the x axis with flip angle $\alpha$ [9] followed immediately by a pulse about the y axis with flip angle $\alpha$ [12]. It was implemented based on the same 3D spiral UTE sequence used for VFA T1 mapping and PRF temperature mapping. A lookup table for flip angles, off-resonance phases accrued during RF, and signal phases was created via simulation.

A phantom was constructed composed of bovine femur cortical bone immersed in 1% agar and 7.8 mM $CuSO_4$ solution. It was pre-heated by approximately 35° C. water bathing for 40 min before being imaged transaxially in a cooling experiment with approximately 10° C. temperature change. The bone's long axis was aligned with the B0 field to minimize susceptibility effects. Two cylinders of unheated agar gel phantom were placed next to the bone-gel phantom to detect potential field drift. MRI data was collected on a 1.5T scanner (MAGNETOM Avanto, Siemens Healthcare, Erlangen, Germany) using the standard head coil. The UTE sequence parameters were: TR 20 ms, TE 0.05/10 ms, FAs 15°/25°, matrix 128×128×10, volume 200×200×80 mm, 64 spiral interleaves, RF duration 60 μs, ⅞ Kz partial Fourier sampling, and three temporal frames with approximately 20 min intervals. Scan time for each FA was 16 s and each frame consisted of two FAs. In a human study, the sequence volume was changed to 256×256×140 m and sagittal images were scanned without heating. In both studies, the phase-sensitive sequence used FA 25°, TE/TR=0.29/30 ms, full Kz sampling, and the other parameters were identical to those for the UTE sequence. 3D field maps were acquired.

VFA and PRF were applied on the first and second echoes respectively. The bone regions were segmented via scaled subtraction. nB1 maps were generated with the phase sensitive method and extrapolated into the bone regions using nearest neighbors, which were then used to correct the flip angles applied for VFA acquisition. With the short RF duration in the UTE sequences, the transverse relaxation of the bone during RF was considered minimal such that B1 maps alone could be used for flip angle correction.

Figure 18:
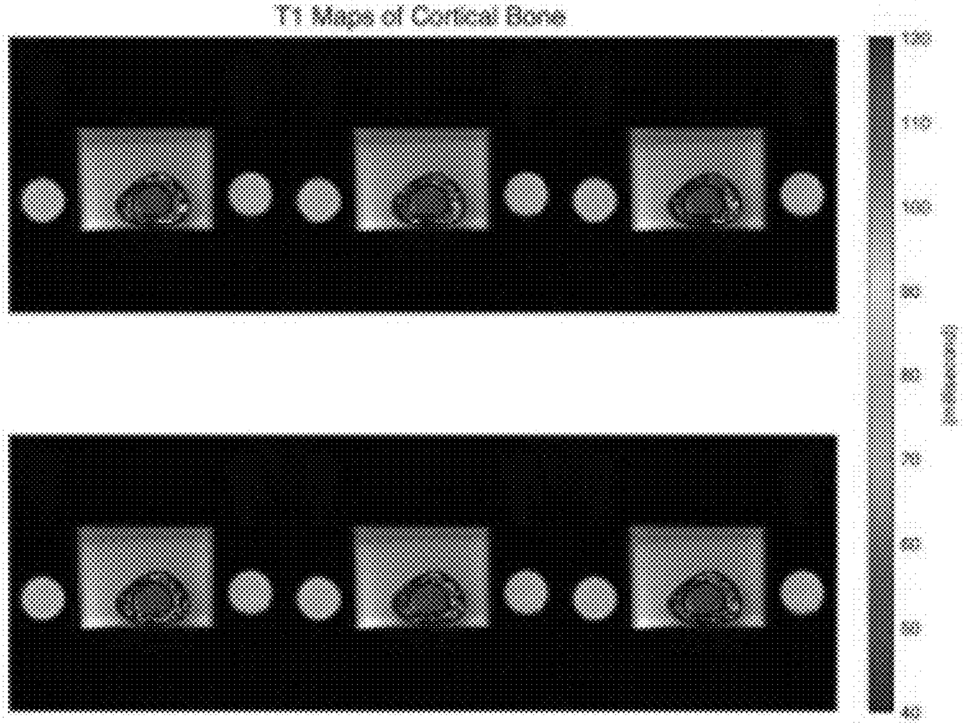
FIG. 18 illustrates three frames of uncorrected (top) and corrected (bottom) T1 maps in the cortical bone in the cooling experiment. The frames correspond to those in FIGS. 15 and 16.
Figure 19:
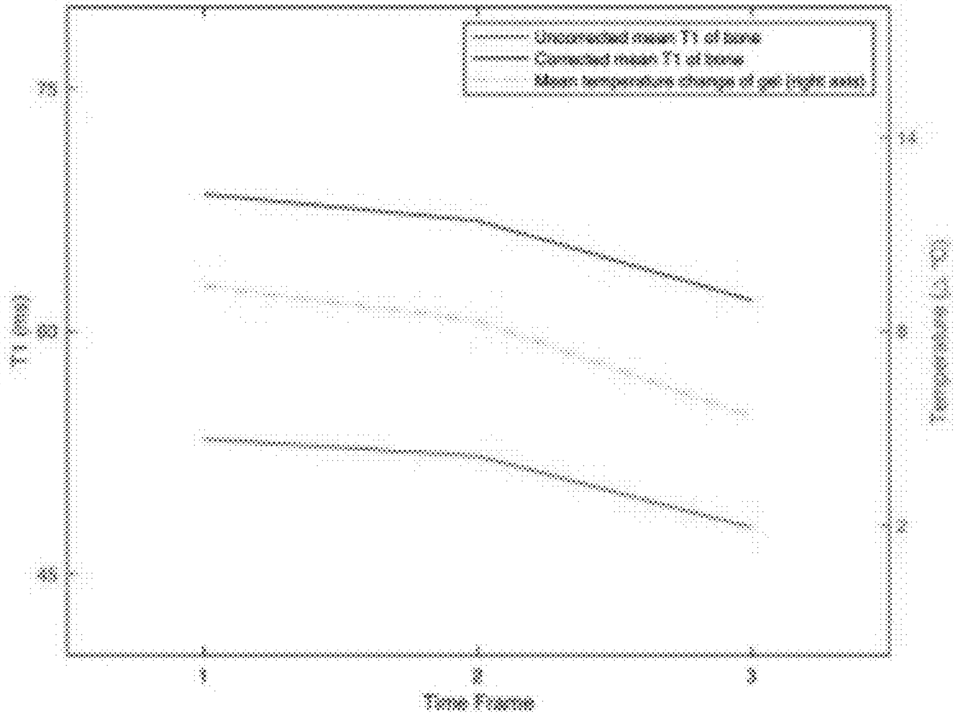
FIG. 19 illustrates three frames of mean T1 values of cortical bone and mean temperatures of agar gel. The corrected T1 values are about 15 ms higher than the uncorrected values. Downward trends of T1 and temperature match. The frames correspond to those in FIGS. 14 and 16.
Figure 20:
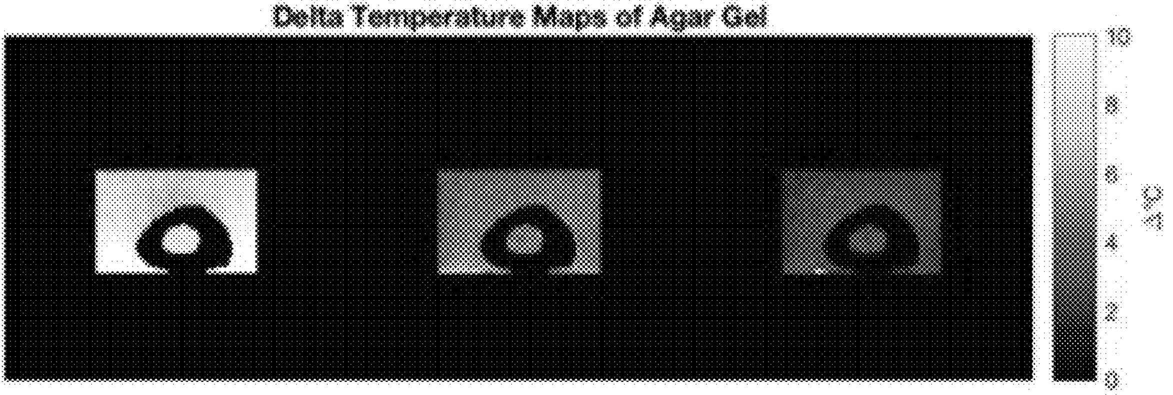
FIG. 20 illustrates three frames of delta temperature maps of agar gel by PRF. The frames correspond to those in FIGS. 14 & 15.
Figure 21:
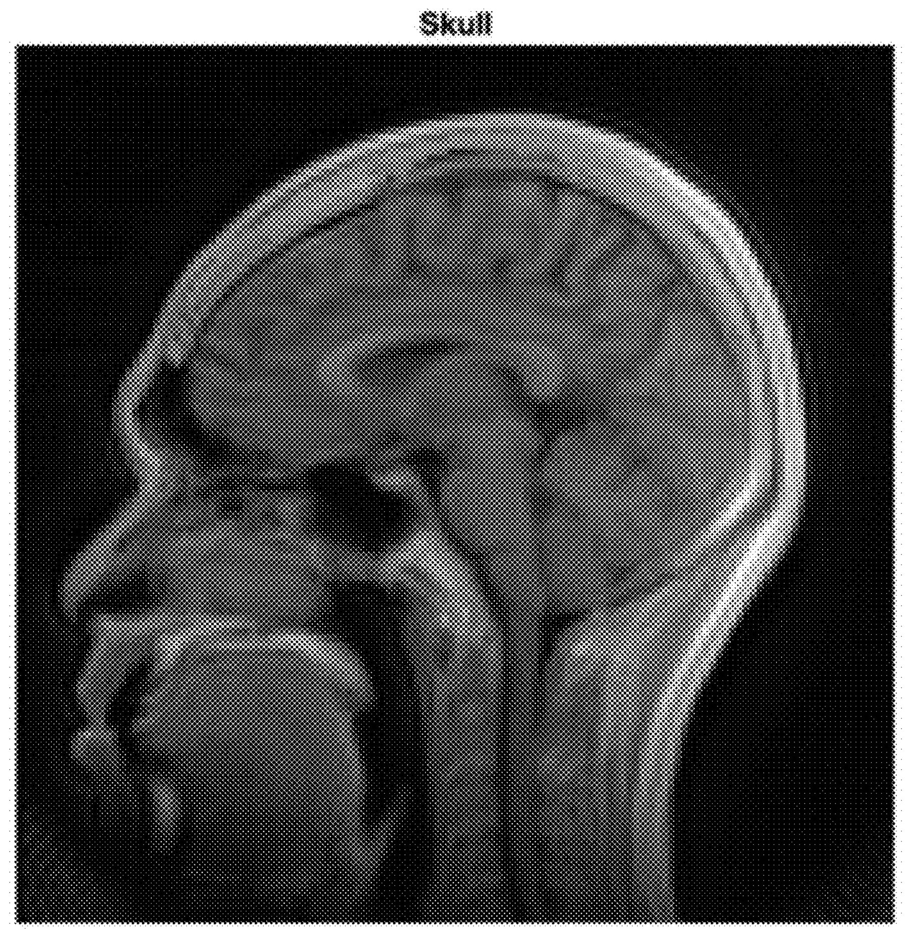
FIG. 21 illustrates the skull that is highlighted by scaled subtraction according to aspects of this disclosure.
Figure 22:
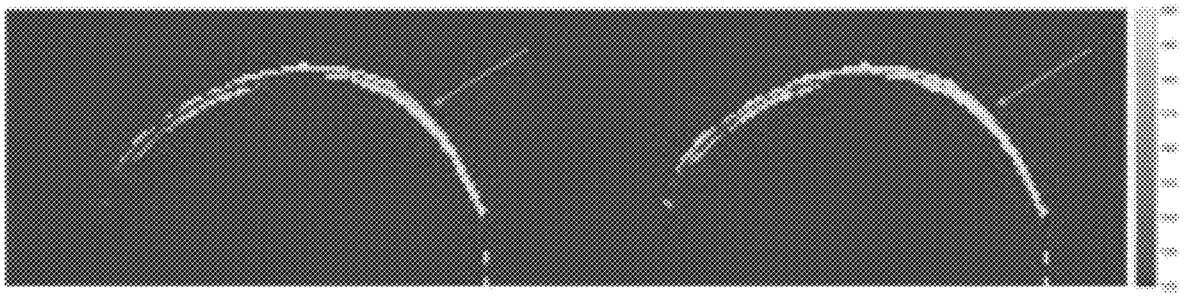
FIG. 22 illustrates the uncorrected (left) and corrected (right) T1 maps of the skull. Arrows show improved homogeneity.

In the cooling experiment, three frames of uncorrected and corrected T1 maps of bovine cortical bone were calculated and shown in FIG. 18. The mean bone T1 and gel delta temperature are plotted in FIG. 19. The corrected bone T1 values are about 15 ms higher than the uncorrected. The delta temperature maps are plotted in FIG. 20. Downward trends of T1 and temperature match in FIGS. 19 and 20. In the human scan, the skull was segmented in FIG. 21. In FIG. 22, the corrected T1 map on the right is more homogenous than the uncorrected on the left, particularly in the back portion of the skull. The calculated T1 values of the bovine cortical bone and the human skull are significantly different, which is similar to the variance in the reported values. Katsiri et al explained this as the result of percentage of bound and pore water, field strength, etc.

A method using extrapolated B1 maps to correct VFA T1 mapping in cortical bone was proposed, implemented, and tested in both phantom and human experiments. The T1 maps matched the PRF temperature in the phantom experiment and rendered higher homogeneity in the human skull scan. Future work will include increasing SNR and image acceleration.

Third Embodiment and Third Test Results

Magnetic Resonance (MR) thermometry is used in monitoring non-invasive heating-induced therapies such as focused ultrasound surgery and laser interstitial thermal therapy [17]. During transcranial MR-guided Focused Ultrasound (MRgFUS) surgery, unintended heating of the skull and nearby soft tissue may occur, causing pain and damage. Monitoring of this heating is challenging because a large volume that contains different tissues should be covered within a short interval.

A method using a dual-echo 3D spiral ultra-short echo time (UTE) sequence has been proposed to address this problem [18]. Variable flip angle (VFA) T1 mapping and the proton resonance frequency (PRF) shift method were applied to the data from the two echoes. However, the resulting temporal resolution was relatively low, and thus acceleration is needed. Low-rank plus sparse (L+S) matrix decomposition is naturally suited for fast dynamic MRI [19]. Multi-frame thermometry data can be divided into the temporally related background component L, and the temporally independent overlay component S. An aspect of an embodiment of the present invention provides a system, method and computer readable medium that uses the L+S model to accelerate reconstruction of retrospectively under-sampled dual-echo 3D spiral UTE MRI data. A validation experiment was conducted with a bone-gel phantom.

Method:

The L+S model for reconstructing under-sampled dynamic spiral data is represented by the convex optimization problem below [19]:

$$\min\|L\| * = \lambda\|TS\|_1 \text{ s.t. } E(L+S) = d,$$

where $\|\cdot\|_*$ is the nuclear norm, $\|\cdot\|_1$ is the $l_1$-norm, λ is a weighting factor, T is a sparsifying operator, E is a non-uniform fast Fourier transform (NUFFT) operator, and d is the raw data.

A phantom was made by surrounding bovine femur cortical bone with agar gel both inside and outside. A cooling experiment was carried out with ~10° C. temperature change. Fully-sampled MRI data was collected on a 3T scanner (MAGNETOM Prisma, Siemens Healthcare, Erlangen, Germany) using a 32-channel head coil. The sequence parameters were: TR 30 ms, TE 0.05/10 ms, flip angles 15°/30°, matrix size 96×96×10, resolution 1.35×1.35×10 $mm^3$, 64 spiral interleaves, RF duration 60 μs. In each of 16 cycles, one scan was performed at the lower flip angle and another at the higher. The data from the first cycle was discarded.

The data was retrospectively under-sampled with an acceleration factor of four. For each frame, the spiral interleaves were selected evenly, and the starting index was incremented by three in order to increase incoherence in the acquisition space that is required by the L+S model for removing noise-like aliasing artifacts [19]. The coil sensitivity maps were generated by applying the ESPIRIT method [20] on the first frame of data. The VFA-T1 and PRF methods were used for the two echoes respectively on both the fully sampled and under-sampled data. Comparison was made between them for each method. Aliasing artifacts were also analyzed. A study of L+S model acceleration of PRF and VFA-T1 thermometry with a dual-echo 3D spiral UTE sequence was conducted with retrospective×4 under-sampling. The aliasing artifacts were significantly removed with temporally incoherent spiral interleaves. The resulting T1 maps were close to those from fully-sampled data. The PRF temperature values showed low deviation. Embodiments in future work include, but not limited thereto, SNR improvement, calibration of the bone T1-temperature coefficient, and prospective studies.

Results

Figure 23:
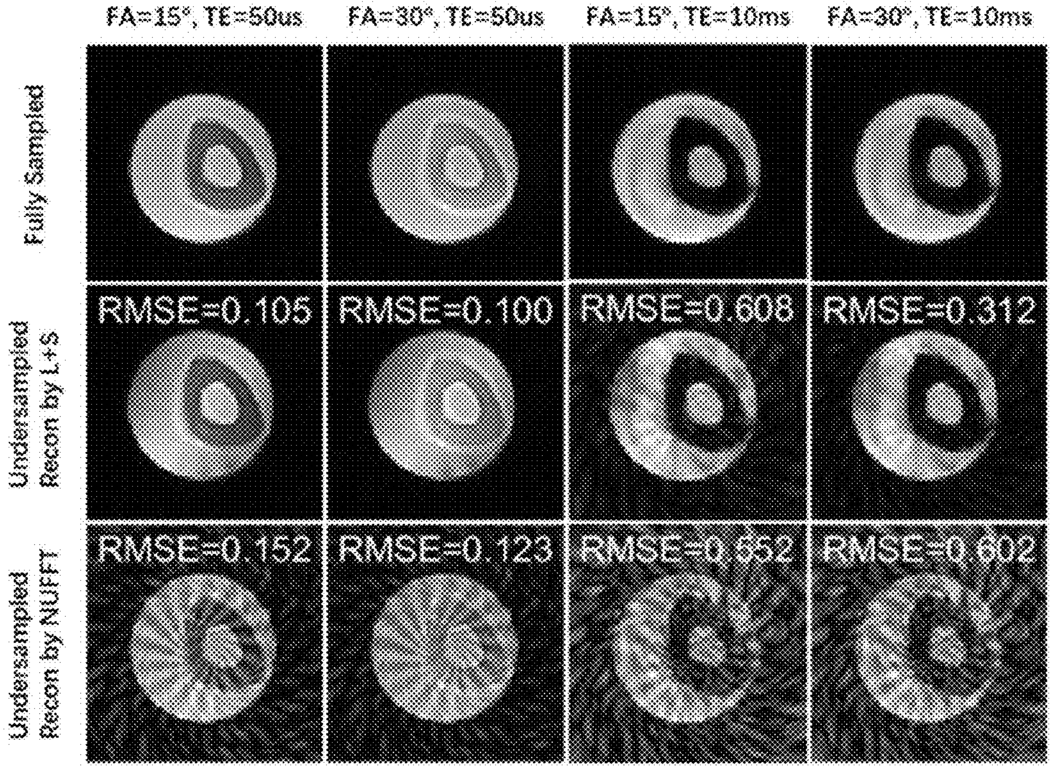
FIG. 23 illustrates images reconstructed from fully-sampled data (first row) and from under-sampled data by L+S (second row), and by NUFFT (third row) are displayed for each combination of flip angle and TE. RMSEs of the under-sampled data are also shown.

The reconstructed (magnitude) images of a middle slice from fully-sampled data and from under-sampled data by L+S and by NUFFT are displayed in FIG. 23. The root-mean-square errors (RMSE) of the L+S groups are generally smaller than those for the NUFFT groups except for the third column. The aliasing artifacts caused by under-sampling were dramatically removed by the L+S method.

Figure 24:
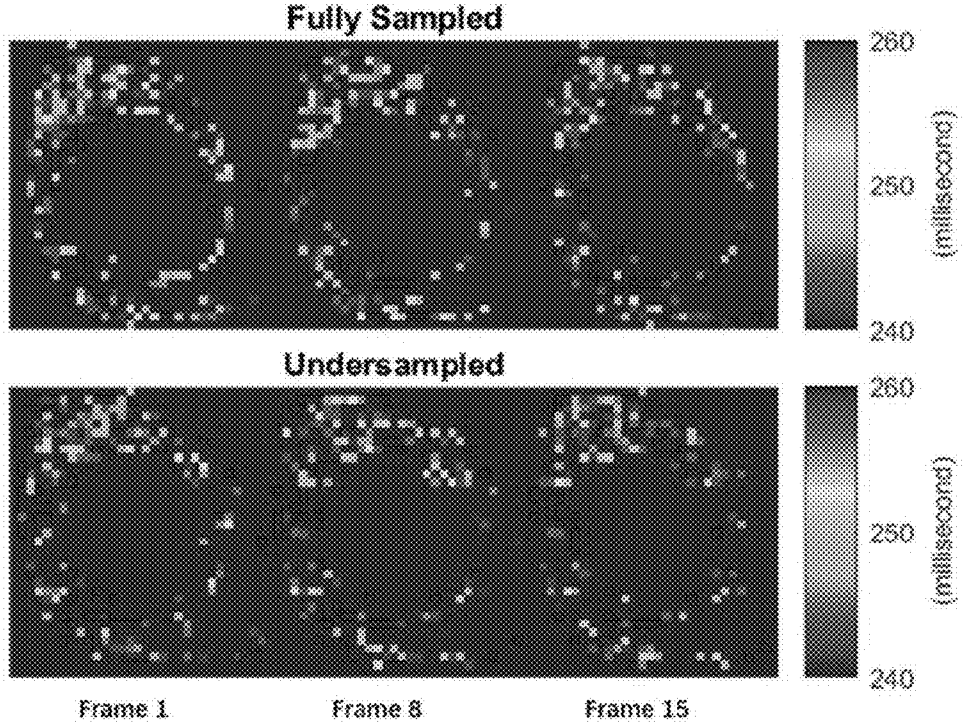
FIG. 24 illustrates PRF temperature maps from fully-sampled data (first and third rows) and from under-sampled data by L+S (second and fourth rows). Rectangles are the ROIs for FIG. 14
Figure 25:
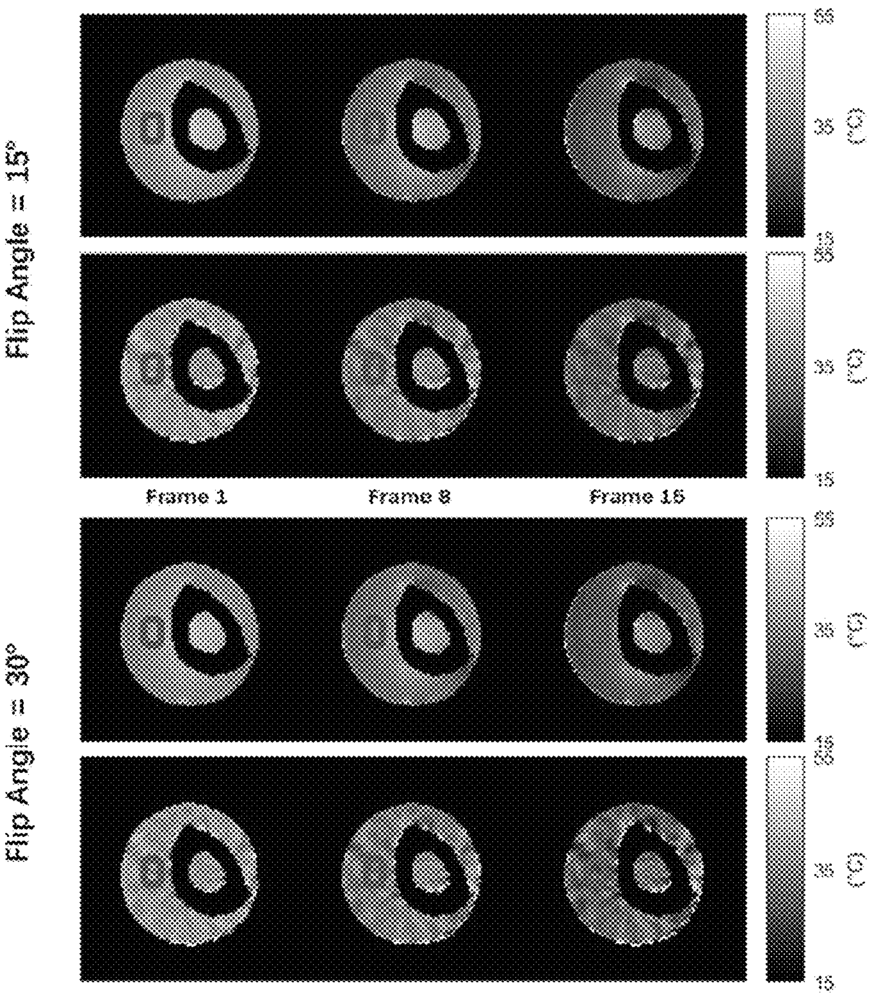
FIG. 25 illustrates data for the spatially averaged PRF temperature curves for the ROIs in FIG. 24.
Figure 26:
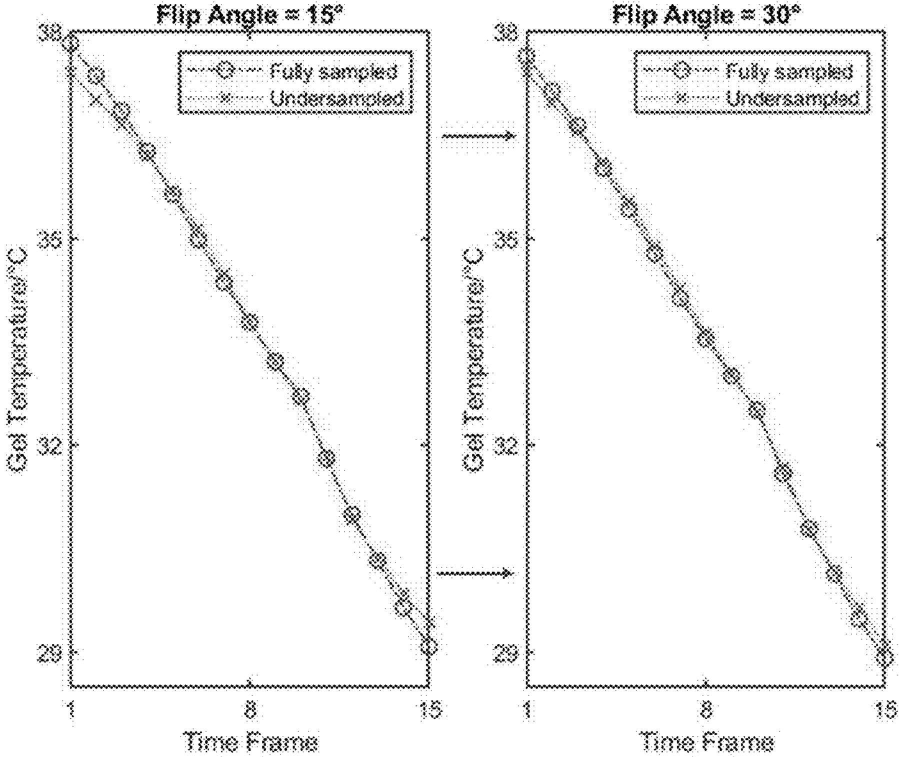
FIG. 26 shows results for gel temperature according to flip angle as set forth in this disclosure.

The VFA-T1 results of the bone are shown in FIG. 24. Similar noise levels are observed in both rows. Despite the small temperature change, a slight decrease of intensity is observed in both rows, which qualitatively aligns with prior calibration research [22]. The PRF temperature distributions are shown in FIG. 25. Minor aliasing artifacts can be observed in the temperature maps. Although increasing iterations in the L+S model could eliminate the aliasing artifacts, it does not improve thermometry accuracy significantly. The mean temperature curves from the rectangles in FIG. 24 is plotted in FIG. 26. For each flip angle, the temperature calculated from under-sampled data deviates less than 1° C. from the temperature from fully-sampled data.

Example Embodiments

Figure 27:
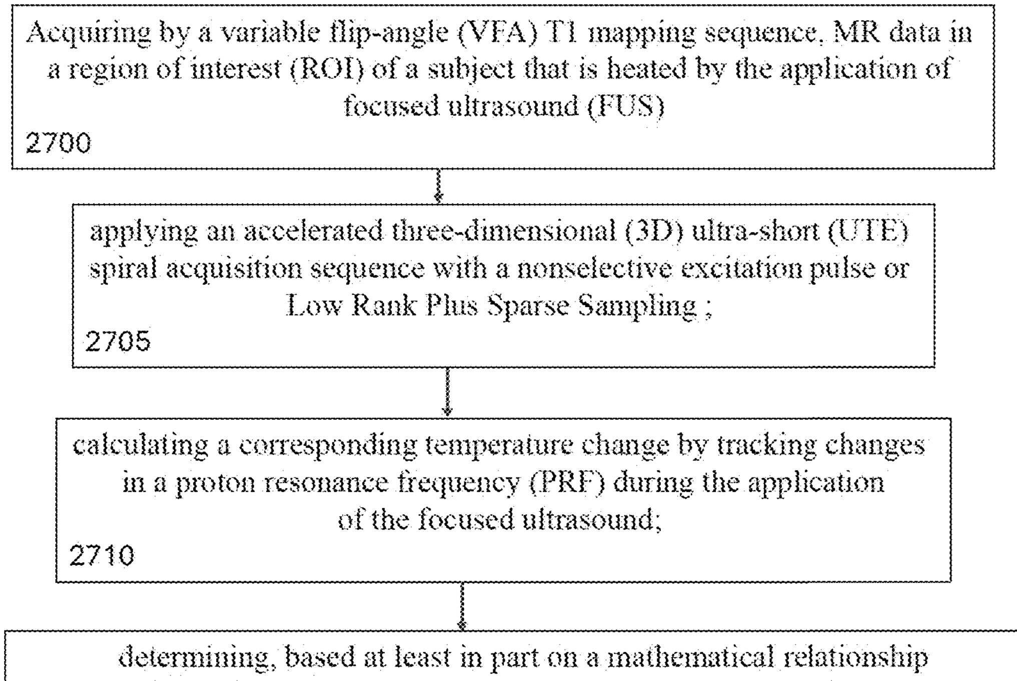
FIG. 27 is a flow chart of example methods of this disclosure.

The following embodiments are summarized in FIG. 27 at blocks 2700, 2705, 2710, and 2715

In one embodiment, a method for magnetic resonance (MR) based thermometry includes acquiring, by a variable flip-angle (VFA) T1 mapping sequence, MR data in an area of interest of a subject corresponding to cortical bone of at least part of the skull that is heated by the application of focused ultrasound (FUS) to a selective portion of the brain of the subject, wherein the MR data comprises a plurality of T1 values over time that include a first point in time and a second, later point time, and wherein the acquisition of the MR data comprises applying an accelerated three-dimensional (3D) ultra-short (UTE) spiral acquisition sequence with a nonselective excitation pulse; calculating a corresponding temperature change by tracking changes in a proton resonance frequency (PRF) during the application of the focused ultrasound; determining, based at least in part on a mathematical relationship established by T1 mapping thermometry produced according to the T1 mapping sequence and the changes in the proton resonance frequency (PRF), a temperature change in the cortical bone that occurs between the first point in time and the second point in time, and wherein the temperature change is caused at least in part by a change in the applied FUS.

In another embodiment, a method for magnetic resonance (MR) based thermometry includes acquiring, by a variable flip-angle (VFA) T1 mapping sequence, MR data in an area of interest of a subject corresponding to cortical bone of at least part of the skull that is heated by the application of focused ultrasound (FUS) to a selective portion of the brain of the subject, wherein the MR data comprises a plurality of T1 values over time that include a first point in time and a second, later point time, and wherein the acquisition of the MR data comprises applying an accelerated three-dimensional (3D) ultra-short (UTE) spiral acquisition sequence with a low rank plus sparse sampling method; calculating a corresponding temperature change by tracking changes in a proton resonance frequency (PRF) during the application of the focused ultrasound; determining, based at least in part on a mathematical relationship established by T1 mapping thermometry produced according to the T1 mapping sequence and the changes in the proton resonance frequency (PRF), a temperature change in the cortical bone that occurs between the first point in time and the second point in time, and wherein the temperature change is caused at least in part by a change in the applied FUS.

In another embodiment, a method for magnetic resonance (MR) based thermometry includes calculating a corresponding temperature change by tracking changes in a proton resonance frequency (PRF) during the application of the focused ultrasound; tabulating a phase sensitive B1 map of soft tissue subject to the focused ultrasound; extrapolating the phase sensitive B1 map of soft tissue to form a phase sensitive B1 map of bone tissue proximate the soft tissue; acquiring, by a variable flip-angle (VFA) T1 mapping sequence, MR data in an area of interest of a subject corresponding to cortical bone of at least part of the skull that is heated by the application of focused ultrasound (FUS) to a selective portion of the brain of the subject, using the B1 map of the bone tissue to correct flip angles in the T1 mapping sequence; wherein the MR data comprises a plurality of T1 values over time that include a first point in time and a second, later point time, and wherein the acquisition of the MR data comprises applying an accelerated three-dimensional (3D) ultra-short (UTE) spiral acquisition sequence with a low rank plus sparse sampling method; and determining, based at least in part on a mathematical relationship established by T1 mapping thermometry produced according to the T1 mapping sequence and the changes in the proton resonance frequency (PRF), a temperature change in the cortical bone that occurs between the first point in time and the second point in time, and wherein the temperature change is caused at least in part by a change in the applied FUS.

REFERENCES

The following references are listed to provide attribution by reference number. Each of these references is incorporated by reference as if set forth fully herein. The following patents, applications and publications as listed below and throughout this document are hereby incorporated by reference in their entirety herein, and which are not admitted to be prior art with respect to the present invention by inclusion in this section.

[1] Gilbo Y, Sporkin H, Fielden S, Mugler J P, Miller W, Allen S, Meyer C H. Detecting T1-based signal reduction in focused ultrasound heating of bone using a 3D spiral ultrashort echo time sequence. Proceedings 27th Annual Meeting ISMRM, Montréal. 2019:3812.

[2] Pinton G, Aubry J F, Bossy E, Muller M, Pernot M, Tanter M. Attenuation, scattering, and absorption of ultrasound in the skull bone. Med Phys. 2012 January; 39 (1):299-307.

[3] Schwartz M L, Yeung R, Huang Y, Lipsman N, Krishna V, Jain J D, Chapman M G, Lozano A M, Hynynen K. Skull bone marrow injury caused by M R-guided focused ultrasound for cerebral functional procedures. J Neurosurg. 2018 May 4; 130 (3):758-762.

[4] Sporkin H, Gilbo Y, Fielden S, Mugler J P, Miller W, Pfeffer J, Kiefer B, Meyer C H. Detecting T1-based signal reduction in focused ultrasound heating of bone at 1.5T using a 3D spiral ultra-short echo time sequence. Proceedings 26th Annual Meeting ISMRM, Paris. 2018:1495

[5] Han M, Rieke V, Scott S J, Ozhinsky E, Salgaonkar V A, Jones P D, Larson P E, Diederich C J, Krug R. Quantifying temperature-dependent T1 changes in cortical bone using ultrashort echo-time MRI. Magn Reson Med. 2015 December; 74(6):1548-55.

[6] Wang P., Evaluation of MR Thermometry with Proton Resonance Frequency Method at 7T; Quant. Imaging Med. Surgery 2017; 7(2):259-266. doi: 10.21037/qims.2017.03.05

[7] Botnar, R. M. et al, Temperature Quantification Using Proton Frequency Shift Technique: In Vitro and In Vivo Validation in an Open 0.5 Tesla Interventional MR Scanner During RF Ablation; Journal of Magnetic Resonance Imaging 13:437-444(2001).

[8] Chen S, Gilbo Y K, Sporkin H L, Fielden S W, Allen S P, Mugler J P, Miller G W, Meyer C H. Combining Proton Resonance Frequency Shift and T1-mapping Thermometry with a 3D Spiral Ultra-Short Echo Time Sequence. Proc. Intl. Soc. Mag. Reson. Med. 2022; 30:2151.

[9] Lee Y, Callaghan M F, Nagy Z. Analysis of the Precision of Variable Flip Angle T1 Mapping with Emphasis on the Noise Propagated from R F Transmit Field Maps. Front Neurosci. 2017 Mar. 9; 11:106.

[10] Cunningham C H, Pauly J M, Nayak K S. Saturated double-angle method for rapid B1+ mapping. Magn Reson Med. 2006 June; 55(6):1326-33.

[11] Yarnykh V L. Actual flip-angle imaging in the pulsed steady state: a method for rapid three-dimensional mapping of the transmitted radiofrequency field. Magn Reson Med. 2007 January; 57(1):192-200.

[12] Morrell G R. A phase-sensitive method of flip angle mapping. Magn Reson Med. 2008 October; 60(4):889-94.

[13] Morrell G R, Schabel M C. An analysis of the accuracy of magnetic resonance flip angle measurement methods. Phys Med Biol. 2010 Oct. 21; 55(20):6157-74.

[14] Pohmann R, Scheffler K. A theoretical and experimental comparison of different techniques for $B_1$ mapping at very high fields. NMR Biomed. 2013 March; 26(3):265-75.

[15] Fielden S, Mugler J, Miller W, Stemmer A, Pfeuffer J, Kiefer B, Meyer C. A variable-TE stack-of-spiral sequence for 3D UTE imaging. Proc. Intl. Soc. Mag. Reson. Med. 2016; 24:1062

[16] Ketsiri T, Uppuganti S, Harkins K D, Gochberg D F, Nyman J S, Does M D. T1 Relaxation of Bound and Pore Water in Cortical Bone. NMR Biomed. 2023 May; 36(5): e4878.

[17] Odéen H, Parker D L. Improved M R thermometry for laser interstitial thermotherapy. Lasers Surg Med. 2019 March; 51(3):286-300.

[18] Chen S, Gilbo Y K, Sporkin H L, Fielden S W, Allen S P, Mugler J P, Miller G W, Meyer C H, Combining Proton Resonance Frequency Shift and T1-mapping Thermometry with a 3D Spiral Ultra-Short Echo Time Sequence. Proceedings 30th Annual Meeting ISMRM, London. 2022:2151.

[19] Otazo R, Candès E, Sodickson D K. Low-rank plus sparse matrix decomposition for accelerated dynamic MRI with separation of background and dynamic components. Magn Reson Med. 2015 March; 73(3):1125-36.

[20] Uecker M, Lai P, Murphy M J, Virtue P, Elad M, Pauly J M, Vasanawala S S, Lustig M. ESPIRIT—an eigenvalue approach to auto-calibrating parallel MRI: where SENSE meets GRAPPA. Magn Reson Med. 2014 March; 71(3): 990-1001.

[21] Han M, Rieke V, Scott S J, Ozhinsky E, Salgaonkar V A, Jones P D, Larson P E, Diederich C J, Krug R. Quantifying temperature-dependent T1 changes in cortical bone using ultrashort echo-time MRI. Magn Reson Med. 2015 December; 74(6):1548-55.

CONCLUSION

The specific configurations, choice of materials and the size and shape of various elements can be varied according to particular design specifications or constraints requiring a system or method constructed according to the principles of the disclosed technology. Such changes are intended to be embraced within the scope of the disclosed technology. The presently disclosed embodiments, therefore, are considered in all respects to be illustrative and not restrictive. The patentable scope of certain embodiments of the disclosed technology is indicated by the appended claims, rather than the foregoing description.

What is claimed is:

1. A method for magnetic resonance (MR) based thermometry, comprising:

acquiring, by a variable flip-angle (VFA) T1 mapping sequence, MR data in an area of interest of a subject corresponding to cortical bone of at least part of a skull of a subject that is heated by application of focused ultrasound (FUS) to a selective portion of a brain of the subject, wherein the MR data comprises a plurality of T1 values over time that include a first point in time and a later, second point in time, and wherein the acquisition of the MR data comprises obtaining dual echo MR data by applying an accelerated three-dimensional (3D) ultrashort (UTE) spiral acquisition sequence with a nonselective excitation pulse;

achieving a selected temporal resolution by applying Low-Rank Plus Sparse Matrix Decomposition to the dual echo MR data;

calculating a corresponding temperature change in the cortical bone by tracking changes in a proton resonance frequency (PRF) during the application of the focused ultrasound (FUS);

determining, based at least in part on a mathematical relationship established by T1 mapping thermometry produced according to the VFA T1 mapping sequence and the changes in the proton resonance frequency (PRF), a temperature change in the cortical bone that occurs between the first point in time and the second point in time, and wherein the temperature change is caused at least in part by a change in the application of FUS.

2. The method of claim 1, wherein acceleration of the accelerated 3D UTE spiral acquisition sequence comprises use of at least one of partial kz acquisition and variable density of spiral interleaves.

3. The method of claim 1, wherein the mathematical relationship is a linear relationship between T1 values and temperature.

4. The method of claim 1, wherein the mathematical relationship is a linear relationship between changes in T1 values over time and a change in temperature over time.

5. The method of claim 1, wherein the change in the application of FUS corresponds to ceasing of the application of FUS for a period of time determined at least in part on the temperature change in the cortical bone.

6. The method of claim 5, wherein the ceasing for the period of time corresponds to a selected period of time selected to allow the selective portion of the brain to cool and prevent unintended damage to the brain.

7. The method of claim 6, wherein the application of FUS resumes after the period of time.

8. The method of claim 1, wherein the change in the application of FUS corresponds to decreasing the energy applied by the FUS.

9. The method of claim 8, wherein the decreasing of energy applied by the FUS is performed for a selected period of time selected to allow the skull to cool and prevent unintended damage to the brain.

10. The method of claim 1, wherein the change in the FUS corresponds to decreasing energy applied by FUS to one or more regions of the skull.

11. A method for magnetic resonance (MR) based thermometry, comprising:

acquiring, by a variable flip-angle (VFA) T1 mapping sequence, MR data in an area of interest of a subject corresponding to cortical bone of at least part of a skull of a subject that is heated by application of focused ultrasound (FUS) to a selective portion of a brain of the subject, wherein the MR data comprises a plurality of T1 values over time that include a first point in time and a later, second point in time, and wherein the acquisition of the MR data comprises obtaining dual echo MR data by applying an accelerated three-dimensional (3D) ultra-short (UTE) spiral acquisition sequence with a nonselective excitation pulse and an echo time of 100 microseconds or less;

achieving a selected temporal resolution by applying Low-Rank Plus Sparse Matrix Decomposition to the dual echo MR data;

calculating a corresponding temperature change in the cortical bone by tracking changes in a proton resonance frequency (PRF) during the application of the focused ultrasound (FUS);

determining, based at least in part on a mathematical relationship established by T1 mapping thermometry produced according to the VFA T1 mapping sequence and the changes in the proton resonance frequency (PRF), a temperature change in the cortical bone that occurs between the first point in time and the second point in time, and wherein the temperature change is caused at least in part by a change in the application of FUS.

12. The method of claim 11, further comprising selecting a temporal resolution of 90 seconds or less.

13. A method for magnetic resonance (MR) based thermometry, comprising:

acquiring, by a variable flip-angle (VFA) T1 mapping sequence, MR data in an area of interest of a subject corresponding to cortical bone of at least part of a skull of a subject that is heated by application of focused ultrasound (FUS) to a selective portion of a brain of the subject, wherein the MR data comprises a plurality of T1 values over time that include a first point in time and a later, second point in time, and wherein the acquisition of the MR data comprises obtaining dual echo MR data by applying an acquisition weighted stack of spirals;

achieving a selected temporal resolution by applying variable duration slice encoding to the MR data;

calculating a corresponding temperature change in the cortical bone by tracking changes in a proton resonance frequency (PRF) during the application of the focused ultrasound (FUS);

determining, based at least in part on a mathematical relationship established by T1 mapping thermometry produced according to the VFA T1 mapping sequence and the changes in the proton resonance frequency (PRF), a temperature change in the cortical bone that occurs between the first point in time and the second point in time, and wherein the temperature change is caused at least in part by a change in the application of FUS.

14. The method of claim 13, wherein applying the acquisition weighted stack of spirals comprises using an echo time of 608 microseconds by further applying a movable spiral readout.

* * * * *